(12) United States Patent
Bickel et al.

(10) Patent No.: US 11,740,266 B2
(45) Date of Patent: Aug. 29, 2023

(54) SYSTEMS AND METHODS FOR MONITORING ENERGY-RELATED DATA IN AN ELECTRICAL SYSTEM

(71) Applicant: Schneider Electric USA, Inc., Andover, MA (US)

(72) Inventors: Jon A. Bickel, Murfreesboro, TN (US); Johannes Menzel, Eybens (FR)

(73) Assignee: Schneider Electric USA, Inc., Andover, MA (US)

( * ) Notice: Subject to any disclaimer, the term of this patent is extended or adjusted under 35 U.S.C. 154(b) by 380 days.

(21) Appl. No.: 17/028,451

(22) Filed: Sep. 22, 2020

(65) Prior Publication Data

US 2022/0091166 A1 Mar. 24, 2022

(51) Int. Cl.
*G01R 21/06* (2006.01)
*G01D 4/00* (2006.01)
*G06Q 50/06* (2012.01)

(52) U.S. Cl.
CPC ............. *G01R 21/06* (2013.01); *G01D 4/004* (2013.01); *G06Q 50/06* (2013.01)

(58) Field of Classification Search
CPC ................................ G01R 21/06; G01D 4/004
USPC ......................................................... 702/61
See application file for complete search history.

(56) References Cited

U.S. PATENT DOCUMENTS

| | | | |
|---|---|---|---|
| 9,292,803 B2 | 3/2016 | Kalogridis et al. | |
| 2010/0070214 A1* | 3/2010 | Hyde ................. | G01R 19/2513 |
| | | | 702/61 |
| 2011/0301894 A1 | 12/2011 | Sanderford, Jr. | |
| 2012/0265586 A1 | 10/2012 | Mammone | |
| 2013/0110621 A1 | 5/2013 | Gupta et al. | |

(Continued)

FOREIGN PATENT DOCUMENTS

WO 2016079229 A1 5/2016

OTHER PUBLICATIONS

Extended European Search Report dated Mar. 4, 2022 for corresponding European Patent Application No. 21194643.9-1202, 9 pages.

*Primary Examiner* — Ricky Go
(74) *Attorney, Agent, or Firm* — Locke Lord LLP; Peter N. Fill; Daniel J. Fiorello

(57) ABSTRACT

A method for monitoring energy-related data in an electrical system includes processing energy-related data from or derived from energy-related signals captured by at least one intelligent electronic device in the electrical system to identify at least one variation/change in the energy-related signals. The method also includes determining if the at least one identified variation/change meets a prescribed threshold or thresholds, and in response to the at least one identified variation/change meeting the prescribed threshold or thresholds, characterizing and/or quantifying the at least one identified variation/change. Information related to the characterized and/or quantified at least one identified variation/change is appended to time-series information associated with the energy-related data, and characteristics and/or quantities associated with the time-series information are evaluated to identify at least one potential load type associated with the characterized and/or quantified at least one identified variation/change.

32 Claims, 8 Drawing Sheets

(56) References Cited

U.S. PATENT DOCUMENTS

| | | | |
|---|---|---|---|
| 2014/0358456 A1* | 12/2014 | Du | G01D 4/004 |
| | | | 702/60 |
| 2016/0033568 A1* | 2/2016 | Tsao | G01R 31/2825 |
| | | | 702/64 |
| 2017/0089960 A1 | 3/2017 | Mashima et al. | |
| 2019/0011283 A1* | 1/2019 | Soutar | H02J 7/00712 |

* cited by examiner (known art)

SYSTEMS AND METHODS FOR MONITORING ENERGY-RELATED DATA IN AN ELECTRICAL SYSTEM

FIELD

This disclosure relates generally to electrical/power systems, and more particularly, to systems and methods for monitoring energy-related data in an electrical system.

BACKGROUND

Today's power monitoring systems measure, capture, alarm, and (periodically) analyze data from electrical systems. As such, it is generally left to end-users to evaluate the data and determine their own conclusions. Unfortunately, the majority of energy consumers do not have time and/or expertise to evaluate energy-related data so that they can identify issues and/or opportunities. Additionally, data produced by power monitoring systems is often an amalgamation of loads making it difficult to identify, quantify, analyze, and respond to discrete issues associated with the energy-related data (or the equipment served therein).

SUMMARY

Described herein are systems and methods related to monitoring energy-related data in electrical systems. The electrical systems may be associated with at least one load, process, building, facility, watercraft, aircraft, or other type of structure, for example. In one aspect of this disclosure, a method for monitoring energy-related data in an electrical system includes processing energy-related data from or derived from energy-related signals captured by at least one intelligent electronic device (IED) in the electrical system to identify at least one variation/change in the energy-related signals. The method also includes determining if the at least one identified variation/change meets a prescribed threshold or thresholds, and in response to the at least one identified variation/change meeting the prescribed threshold or thresholds, characterizing and/or quantifying the at least one identified variation/change (e.g., identifying what changed and how much it changed). Information related to the characterized and/or quantified at least one identified variation/change is appended to time-series information associated with the energy-related data. Additionally, characteristics and/or quantities associated with the time-series information are evaluated to identify at least one potential load type associated with the characterized and/or quantified at least one identified variation/change. In accordance with some embodiments of this disclosure, the at least one potential load type corresponds to at least one subset of load types in the electrical system. For example, the electrical system may include a plurality of load types (e.g., load types A, B, C, D, etc.), and the at least one subset of load types may include one or more of the plurality of load types (e.g., load type A and/or load type B). The plurality of load types (and the at least one subset of load types) may include machinery, apparatuses and/or components associated with at least one application and/or process, for example. It is understood that the term "loads" as used herein may refer to any component, any element and any process. The load(s) include, for example, a source such as a generator, a load coupled to the source such as a motor and/or drive, infrastructure such as a transformer, and/or a component in the electrical/power system (e.g., capacitor bank, connected device, etc.).

In accordance with some embodiments of this disclosure, one or more actions may be taken in response to the at least one potential load type (i.e., the at least one subset of load types) being identified using the above-discussed method (and/or other systems and/or methods discussed herein). For example, in some embodiments the one or more actions taken may include providing an indication (e.g., visual and/or audio indication) of the identified at least one potential load type. The indication may be communicated or presented, for example, to an end-user, equipment manufacturer, services team and/or other interested individual or party. The indication may be provided, for example, on and/or by at least one of a report, a list, a text, an email, audibly, and an interface of a screen/display (e.g., a display device of a computing device or system associated with the electrical system). In one example implementation, the indication may be graphically represented, for example, on a map including icons for each identified load and/or load type (e.g., a generic "motor" icon, a generic "heating" icon), leveraging an existing single-line diagram of the power system to build such a map. In accordance with some embodiments of this disclosure, the report, text, etc. in, on or by which the indication is provided may include relevant information associated with the identified at least one potential load type and include one or more indicators (e.g., icons, symbols, etc.) indicative of the identified at least one potential load type and/or the relevant information. For example, the report, text, etc. may provide location(s) of the identified at least one potential load type and/or the characteristics and/or quantities associated with the identified at least one potential load type. The location(s) may be described or visually shown (e.g., on a static or interactive map) and the characteristics and/or quantities may be represented or described using associated indicators (e.g., configurable indicators) that are apparent to one of ordinary skill in the art. The report, text, etc. may additionally or alternatively provide a confidence factor that the identified at least one potential load type is the actual load type.

In accordance with some embodiments of this disclosure, the report, text, etc. may additionally or alternatively provide actionable recommendations for responding, for example, to any issues associated with the identified at least one potential load type (e.g., the at least one identified variation/change) and/or identified efficiency improvements associated with the identified at least one potential load type as a few examples. The actionable recommendations may correspond, for example, to the one or more actions taken in response to the at least one potential load type being identified, and the actionable recommendations (which may result in one or more actions being taken) may be automatically, semi-automatically and/or manually performed. As one example, the one or more the actions may be taken by at least one system and/or device associated with the electrical system, for example, in response to receiving a message/information/command/signal from the system(s) and/or device(s) responsible for identifying the at least one potential load type. The at least one system and/or device may correspond to or include, for example, a control system associated with the electrical system. The control system may control at least one component (e.g., apparatus) in the electrical system, for example. In some embodiments, the actions (e.g., the control of at least one component in the electrical system) and/or the system(s) and/or device(s) performing the actions (e.g., the control system) may be based, at least in part, on the identified at least one potential load type and/or the at least one application and/or process associated with the electrical system, for example. It is understood that there are many other actions that may be taken, and many ways in which the actions may be taken, as will be appreciated from further discussions below.

In some embodiments, the above-discussed method (and/or other system(s) and/or method(s) discussed herein) may be implemented on the at least one IED called for in the above-discussed method (and/or other systems and/or methods discussed herein). Additionally, in some embodiments the above-discussed method (and/or other systems and/or methods discussed herein) may be implemented partially or fully remote from the at least one IED, for example, in a gateway, a cloud-based system, on-site software, a remote server, etc. (which may alternatively be referred to as a "head-end" or "Edge" system herein). In some embodiments, the at least one IED may be coupled to measure energy-related signals, receive electrical measurement data from or derived from the energy-related signals at an input, and configured to generate at least one or more outputs. The outputs may be used to identify the at least one potential load type associated with the characterized and/or quantified at least one identified variation/change in the electrical system. Examples of the at least one IED may include a smart utility meter, a power quality meter, and/or another measurement device (or devices). The at least one IED may include breakers, relays, power quality correction devices, uninterruptible power supplies (UPSs), filters, and/or variable speed drives (VSDs), for example. Additionally, the at least one IED may include at least one virtual meter in some embodiments.

The above-discussed method (and/or other systems and/or methods discussed herein) may include one or more of the following features either individually or in combination with other features in some embodiments. For example, in some embodiments the energy-related signals captured by the at least one IED may include at least one of: a voltage signal, a current signal, an input/output (I/O) data, and a derived energy-related value. In some embodiments, the I/O data includes at least one of on/off status(es), open/closed status(es), high/low status(es), temperature(s), pressure(s), and volume(s). Additionally, in some embodiments the derived energy-related value includes at least one of: a calculated, computed, estimated, derived, developed, interpolated, extrapolated, evaluated, and otherwise determined additional energy-related value from the at least one of the voltage signal and/or the current signal. In some embodiments, the derived energy-related value includes at least one of: active power, apparent power, reactive power, energy, harmonic distortion, power factor, magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase currents, phase angle(s), impedance(s), sequence component(s), total voltage harmonic distortion, total current harmonic distortion, three-phase current(s), phase voltage(s), line voltage(s) and/or other similar/related parameters. In some embodiments, the derived energy-related value includes at least one energy-related characteristic, the energy-related characteristic including magnitude, direction, phase angle, percentage, ratio, level, duration, associated frequency components, impedance, energy-related parameter shape, and/or decay rate. It is understood that the energy-related signals may include (or leverage) substantially any electrical parameter derived from at least one of the voltage and current signals (including the voltages and currents themselves), including, for example, load levels and patterns, as will be understood from further discussions below.

In some embodiments, the energy-related signals may be continuously or semi-continuously captured and/or logged by the at least one IED, and variation(s)/change(s) identified in the energy-related signals may be updated (e.g., evaluated/re-evaluated, prioritized/re-prioritized, tracked, etc.) in response thereto. For example, variation(s)/change(s) may initially be identified from energy-related signals captured at a first time, and may be updated or revised in response to (e.g., to include or incorporate) variation(s)/change(s) identified from energy-related signals captured at a second time. As variation(s)/change(s) are identified, the variation(s)/change(s) may be characterized and/or quantified, information related to the characterized and/or quantified identified variation(s)/change(s) may be appended to time-series information associated with energy-related data, and characteristics and/or quantities associated with the time-series information may be evaluated to identify at least one potential load type associated with the characterized and/or quantified identified variation(s)/change(s), for example. The appended information may include, for example, tagged indications on the time-series information, metadata, characteristics and/or other information related to the characterized and/or quantified identified variation(s)/change(s).

In some embodiments, the at least one IED capturing the energy-related signals includes at least one metering device. The at least one metering device may correspond, for example, to at least one metering device in the electrical system for which the energy-related data is monitored.

As used herein, an IED is a computational electronic device optimized to perform a particular function or set of functions. Examples of IEDs include smart utility meters, power quality meters, microprocessor relays, digital fault recorders, and other metering devices. IEDs may also be imbedded in variable speed drives (VSDs), uninterruptible power supplies (UPSs), circuit breakers, relays, transformers, or any other electrical apparatus. IEDs may be used to perform measurement/monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data (e.g., waveform data, logged data, I/O data, etc.) as electrical parameters representing operating characteristics (e.g., voltage, current, waveform distortion, power, etc.) of the electrical distribution system. These parameters and characteristics may be analyzed by a user to evaluate potential performance, reliability and/or power quality-related issues, for example. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem (series). For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.

In some embodiments, the metering devices (e.g., IEDs) and equipment/loads of the above and below described systems and methods are installed, located and/or derived from different respective locations (i.e., a plurality of locations) or metering points in the electrical system. A particular IED (e.g., a second IED) may be up-line (i.e., upstream) from another IED (e.g., a third IED) in the electrical system while being down-line (i.e., downstream) from a further IED (e.g., a first IED) in the electrical system, for example.

As used herein, the terms "up-line" and "down-line" (also sometimes referred to as "upstream" and "downstream", respectively) are used to refer to electrical locations within an electrical system. More particularly, the electrical locations "up-line" and "down-line" are relative to an electrical location of an IED collecting data and providing this information. For example, in an electrical system including a plurality of IEDs, one or more IEDs may be positioned (or installed) at an electrical location that is up-line relative to one or more other IEDs in the electrical system, and the one or more IEDs may be positioned (or installed) at an electrical location that is down-line relative to one or more further IEDs in the electrical system. A first IED or load that is positioned on an electrical circuit up-line from a second IED or load may, for example, be positioned electrically closer to an input or source of the electrical system (e.g., an electrical generator or a utility feed) than the second IED or load. Conversely, a first IED or load that is positioned on an electrical circuit down-line from a second IED or load may be positioned electrically closer to an end or terminus of the electrical system than the other IED (so in this case, it will be closer to a load or group of loads).

A first IED or load that is electrically connected in parallel (e.g., on an electrical circuit) with a second IED or load may be considered to be "electrically" up-line from said second IED or load in embodiments, and vice versa. In embodiments, algorithm(s) used for determining a direction of a power quality event (i.e., up-line or down-line) is/are located (or stored) in the IED, cloud, on-site software, gateway, etc. As one example, the IED can record an electrical event's voltage and current phase information (e.g., by sampling the respective signals) and communicatively transmit this information to a cloud-based system. The cloud-based system may then analyze the voltage and current phase information (e.g., instantaneous, root-mean-square (rms), waveforms and/or other electrical characteristic) to determine if the source/origin of an energy-related transient (or other energy-related event) is electrically up-line or down-line from where the IED is electrically coupled to the electrical system (or network).

In some embodiments, the above-discussed at least one system and/or device (e.g., control system) described as taking one or more actions in response to the at least one potential load type being identified, may be or include the IED (e.g., an IED of the claimed at least one IED), on-site/head-end/Edge software (i.e., a software system), a cloud-based control system, a gateway, a system in which data is routed over the Ethernet or some other communications system, etc. In embodiments in which the at least one system and/or device is not the at least one IED or does not include the at least one IED, for example, the at least one system and/or device may be communicatively coupled to the at least one IED. The at least one system and/or device may also be communicatively coupled to at least one of: a cloud-based system, on-site software, a gateway, and another head-end or Edge system associated with the electrical system.

In some embodiments, the energy-related data from or derived from the energy-related signals captured by the at least one IED is processed on at least one of: the cloud-based system, the on-site or Edge software, the gateway, and the other head-end system associated with the electrical system. In these embodiments, for example, the at least one IED may be communicatively coupled to the at least one of: the cloud-based system, the on-site or Edge software, the gateway, and the other head-end system on which the electrical measurement data is processed, analyzed, and/or displayed.

In some embodiments, data associated with the energy-related data is stored (e.g., in a memory device of at least one device or system associated with the electrical system) and/or tracked over a predetermined time period. The predetermined time period may be a user-configured time period, for example. In some embodiments, the stored and/or tracked data includes information associated with identifying the at least one potential load type. The information associated with identifying the at least one potential load type may include, for example, at least one of: the at least one identified variation/change, the characterized and/or quantified at least one identified variation/change, the time-series information, and the evaluated characteristics and/or quantities associated with the time-series information. In some embodiments, the information associated with identifying the at least one potential load type may be saved and/or tracked for future analyses/uses. For example, the stored and/or tracked information may be used to generate a library of load types and associated start/run/change/stop characteristics and/or be added to a pre-existing library of load types and associated start/run/change/stop characteristics. In embodiments in which there is a pre-existing library of load types and associated start/run/change/stop characteristics, the at least one potential load type identified using the systems and methods described herein may be selected from a plurality of potential loads types in the pre-existing library of load types and associated start/run/change/stop characteristics.

It is understood that an input is data that a processor and/or IED (e.g., the above-discussed at least one IED) receives, and an output is data that a processor and/or IED sends. Inputs and outputs may either be digital (e.g., two states such as high/low, one/zero, on/off, etc.) or analog (e.g., continuously variable such as spatial position, temperature, pressure voltage, etc.).

Processors and/or IEDs may convert/reconvert digital and analog input signals to a digital representation for internal processing. Processors and/or IEDs may also be used to convert/reconvert internally processed digital signals to digital and/or analog output signals to provide some indication, action, or other response (such as an input for another processor/IED).

Typical uses of digital outputs may include opening or closing breakers or switches, starting or stopping motors and/or other equipment, and operating other devices and equipment that are able to directly interface with digital signals. Digital inputs are often used to determine the operational status/position of equipment (e.g., is a breaker open or closed, etc.) or read an input synchronous signal from a utility pulsed output. Analog outputs may be used to provide variable control of valves, motors, heaters, or other loads/processes in energy management systems. Finally, analog inputs may be used to gather variable operational data (e.g., to determine for a given motor the different frequent operational stable running modes such torque or speed at a given load) and/or in proportional control schemes.

A few more examples where digital and analog I/O data are leveraged may include (but not be limited to): turbine controls, plating equipment, fermenting equipment, chemical processing equipment, telecommunications, equipment, precision scaling equipment, elevators and moving sidewalks, compression equipment, waste water treatment equipment, sorting and handling equipment, plating equipment temperature/pressure data logging, electrical generation/transmission/distribution, robotics, alarm monitoring and control equipment, as a few examples.

As noted earlier in this disclosure, the energy-related signals captured by the at least one IED may include I/O data. It is understood that the I/O data may take the form of digital I/O data, analog I/O data, or a combination digital and analog I/O data. The I/O data may convey status information, for example, and many other types of information, as will be apparent to one of ordinary skill in the art from discussions above and below.

In one aspect of the present disclosure, a system for monitoring energy-related data in an electrical system includes at least one processor and at least one memory device coupled to the at least one processor. The at least one processor and the at least one memory device are configured to process energy-related data from or derived from energy-related signals captured by at least one IED in the electrical system to identify at least one variation/change in the energy-related signals. The at least one processor and the at least one memory device are further configured to determine if the at least one identified variation/change meets a prescribed threshold or thresholds, and in response to the at least one identified variation/change meeting the prescribed threshold or thresholds, characterize and/or quantify the at least one identified variation/change. Information related to the characterized and/or quantified at least one identified variation/change may be appended to time-series information associated with the energy-related data, and characteristics and/or quantities associated with the time-series information are evaluated to identify at least one potential load type associated with the characterized and/or quantified at least one identified variation/change. In accordance with some embodiments of this disclosure, the at least one potential load type corresponds to at least one subset of load types in the electrical system. Additionally, in accordance with some embodiments of this disclosure, one or more actions are taken in response to identifying the at least one potential load type.

In some embodiments, the above-described system may correspond to a control system (e.g., the previously discussed control system) used for monitoring or controlling one or more parameters associated with the electrical system. As previously discussed, in some embodiments, the control system may be a meter, an IED (e.g., of the at least one IED responsible for capturing the energy-related signals), programmable logic controller (PLC), on-site/head-end software (i.e., a software system), a cloud-based control system, a gateway, a system in which data is routed over the Ethernet or some other communications system, etc.

It is understood that the systems and methods described herein may be responsive to changes in the electrical system(s) in which the systems and methods are provided and/or implemented. For example, the prescribed threshold or thresholds that the at least one identified variation/change is compared to determine if the at least one identified variation/change meets the prescribed threshold or thresholds, may be a dynamic threshold or thresholds that change in response to changes in the electrical system(s). The changes in the electrical system(s) may be detected, for example, from the energy-related signals captured by the at least one IED in the electrical system(s). In one example implementation, the changes are detected after manually training/teaching a system to identify the changes. For example, the specific equipment (or processes) operating at a given time may be described to allow the system to learn (i.e., a form of machine learning). In another example implementation, the changes are detected by automatically identifying operational modes using state of the art machine learning algorithms (e.g., using time series clustering or using spectral or any other algorithms helpful in analysis to identify patterns).

As will become further appreciated from discussions below, the disclosed invention provides, among other features, the ability to characterize voltage, current, and other derived signals to better understand upstream and downstream loads, their operation(s) and impact(s) to the electrical system. The ability to automatically evaluate energy-related data to associate, characterize, quantify, identify, and analyze helps end-users to better understand the operation of their electrical system. It may also provide many more services and solutions opportunities to energy-related companies, such as Schneider Electric, the assignee of the present disclosure.

For example, the disclosed invention provides, among other features, the ability to help:
- single out/isolate issues and problems produced downstream from a single metering device that is monitoring multiple loads;
- automatically quantify the number and types of loads downstream from a single metering device monitoring multiple loads;
- identify metering coverage gaps in the end-user's monitoring system;
- identify product lead generation opportunities according to the identified load numbers and types downstream from a single metering device;
- identify opportunities for targeted services based on end-user's particular electrical system;
- better understand customers loads, how they are used, and their particular issues; and
- better customer relationship though knowledge of their particular electrical system and its operation/issues.

Additionally, it is contemplated that the invention will work with all market segment types (e.g., industrial, commercial, residential, and governmental consumers).

It is understood that there are many other advantages associated with the disclosed invention, as will be appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
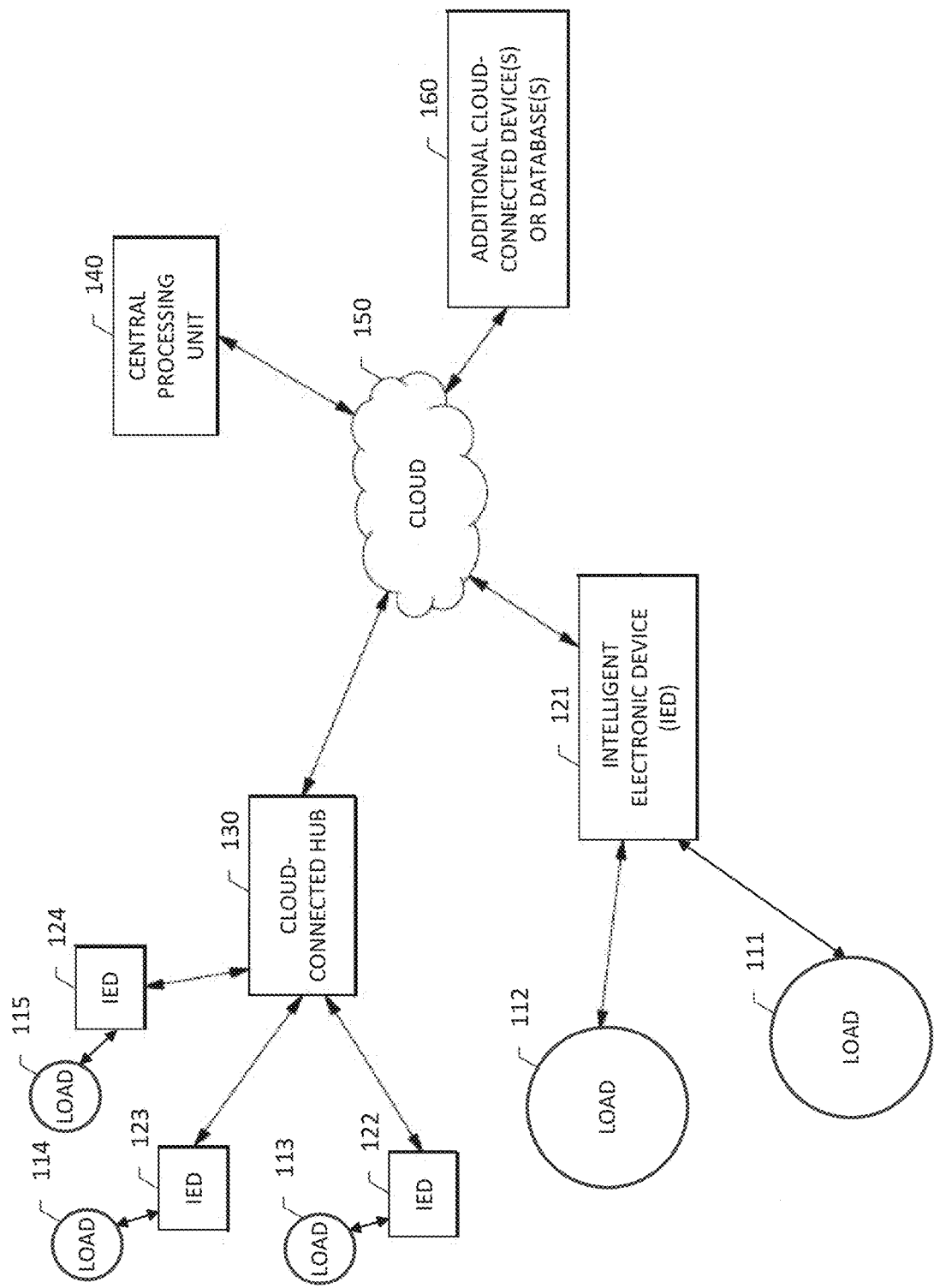
FIG. 1 shows an example electrical system in accordance with embodiments of the disclosure.

Referring to FIG. 1, an example electrical system in accordance with embodiments of the disclosure includes one or more loads (here, loads 111, 112, 113, 114, 115) (also sometimes referred to herein as "equipment" or "apparatuses") and one or more intelligent electronic devices (IEDs) (here, IEDs 121, 122, 123, 124) capable of sampling, sensing or monitoring one or more parameters (e.g., power monitoring parameters) associated with the loads. In embodiments, the loads 111, 112, 113, 114, 115 and IEDs 121, 122, 123, 124 may be installed in one or more buildings or other physical locations or they may be installed on one or more processes and/or loads within a building. The buildings may correspond, for example, to commercial, industrial or institutional buildings.

As shown in FIG. 1, the IEDs 121, 122, 123, 124 are each coupled to one or more of the loads 111, 112, 113, 114, 115 (which may be located "upline" or "downline" from the IEDs in some embodiments). The loads 111, 112, 113, 114, 115 may include, for example, machinery or apparatuses associated with a particular application (e.g., an industrial application), applications, and/or process(es). The machinery may include electrical or electronic equipment, for example. The machinery may also include the controls and/or ancillary equipment associated with the equipment.

In embodiments, the IEDs 121, 122, 123, 124 may monitor and, in some embodiments, analyze parameters (e.g., energy-related parameters) associated with the loads 111, 112, 113, 114, 115 to which they are coupled. The IEDs 121, 122, 123, 124 may also be embedded within the loads 111, 112, 113, 114, 115 in some embodiments. According to various aspects, one or more of the IEDs 121, 122, 123, 124 may be configured to monitor utility feeds, including surge protective devices (SPDs), trip units, active filters, lighting, IT equipment, motors, and/or transformers, which are some examples of loads 111, 112, 113, 114, 115, and the IEDs 121, 122, 123, 124, and may detect ground faults, voltage sags, voltage swells, momentary interruptions and oscillatory transients, as well as fan failure, temperature, arcing faults, phase-to-phase faults, shorted windings, blown fuses, and harmonic distortions, which are some example parameters that may be associated with the loads 111, 112, 113, 114, 115. The IEDs 121, 122, 123, 124 may also monitor devices, such as generators, including input/outputs (I/Os), protective relays, battery chargers, and sensors (for example, water, air, gas, steam, levels, accelerometers, flow rates, pressures, and so forth).

According to another aspect, the IEDs 121, 122, 123, 124 may detect overvoltage and undervoltage conditions (e.g., transient overvoltages), as well as other parameters such as temperature, including ambient temperature. According to a further aspect, the IEDs 121, 122, 123, 124 may provide indications of monitored parameters and detected conditions that can be used to control the loads 111, 112, 113, 114, 115 and other equipment in the electrical system in which the loads 111, 112, 113, 114 and IEDs 121, 122, 123, 124 are installed. A wide variety of other monitoring and/or control functions can be performed by the IEDs 121, 122, 123, 124, and the aspects and embodiments disclosed herein are not limited to IEDs 121, 122, 123, 124 operating according to the above-mentioned examples.

It is understood that the IEDs 121, 122, 123, 124 may take various forms and may each have an associated complexity (or set of functional capabilities and/or features). For example, IED 121 may correspond to a "basic" IED, IED 122 may correspond to an "intermediate" IED, and IED 123 may correspond to an "advanced" IED. In such embodiments, intermediate IED 122 may have more functionality (e.g., energy measurement features and/or capabilities) than basic IED 121, and advanced IED 123 may have more functionality and/or features than intermediate IED 122. For example, in embodiments IED 121 (e.g., an IED with basic capabilities and/or features) may be capable of monitoring instantaneous voltage, current energy, demand, power factor, averages values, maximum values, instantaneous power, and/or long-duration rms variations, and IED 123 (e.g., an IED with advanced capabilities) may be capable of monitoring additional parameters such as voltage transients, voltage fluctuations, frequency slew rates, harmonic power flows, and discrete harmonic components, all at higher sample rates, etc. It is understood that this example is for illustrative purposes only, and likewise in some embodiments an IED with basic capabilities may be capable of monitoring one or more of the above energy measurement parameters that are indicated as being associated with an IED with advanced capabilities. It is also understood that in some embodiments the IEDs 121, 122, 123, 124 each have independent functionality.

In the example embodiment shown, the IEDs 121, 122, 123, 124 are communicatively coupled to a central processing unit 140 via the "cloud" 150. In some embodiments, the IEDs 121, 122, 123, 124 may be directly communicatively coupled to the cloud 150, as IED 121 is in the illustrated embodiment. In other embodiments, the IEDs 121, 122, 123, 124 may be indirectly communicatively coupled to the cloud 150, for example, through an intermediate device, such as a cloud-connected hub 130 (or a gateway), as IEDs 122, 123, 124 are in the illustrated embodiment. The cloud-connected hub 130 (or the gateway) may, for example, provide the IEDs 122, 123, 124 with access to the cloud 150 and the central processing unit 140.

As used herein, the terms "cloud" and "cloud computing" are intended to refer to computing resources connected to the Internet or otherwise accessible to IEDs 121, 122, 123, 124 via a communication network, which may be a wired or wireless network, or a combination of both. The computing resources comprising the cloud 150 may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

The central processing unit 140 may be an example of a cloud computing system, or cloud-connected computing system. In embodiments, the central processing unit 140 may be a server located within buildings in which the loads 111, 112, 113, 114, 115, and the IEDs 121, 122, 123, 124 are installed, or may be remotely-located cloud-based service. The central processing unit 140 may include computing functional components similar to those of the IEDs 121, 122, 123, 124 is some embodiments, but may generally possess greater numbers and/or more powerful versions of components involved in data processing, such as processors, memory, storage, interconnection mechanisms, etc. The central processing unit 140 can be configured to implement a variety of analysis techniques to identify patterns in received measurement data from the IEDs 121, 122, 123, 124, as discussed further below. The various analysis techniques discussed herein further involve the execution of one or more software functions, algorithms, instructions, applications, and parameters, which are stored on one or more sources of memory communicatively coupled to the central processing unit 140. In certain embodiments, the terms "function", "algorithm", "instruction", "application", or "parameter" may also refer to a hierarchy of functions, algorithms, instructions, applications, or parameters, respectively, operating in parallel and/or tandem (series). A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the central processing unit 140 is connected to the cloud 150, it may access additional cloud-connected devices or databases 160 via the cloud 150. For example, the central processing unit 140 may access the Internet and receive information such as weather data, utility pricing data, or other data that may be useful in analyzing the measurement data received from the IEDs 121, 122, 123, 124. In embodiments, the cloud-connected devices or databases 160 may correspond to a device or database associated with one or more external data sources. Additionally, in embodiments, the cloud-connected devices or databases 160 may correspond to a user device from which a user may provide user input data. A user may view information about the IEDs 121, 122, 123, 124 (e.g., IED makes, models, types, etc.) and data collected by the IEDs 121, 122, 123, 124 (e.g., energy usage statistics) using the user device. Additionally, in embodiments the user may configure the IEDs 121, 122, 123, 124 using the user device.

In embodiments, by leveraging the cloud-connectivity and enhanced computing resources of the central processing unit 140 relative to the IEDs 121, 122, 123, 124, sophisticated analysis can be performed on data retrieved from one or more IEDs 121, 122, 123, 124, as well as on the additional sources of data discussed above, when appropriate. This analysis can be used to dynamically control one or more parameters, processes, conditions or equipment (e.g., loads) associated with the electrical system. As noted in the Summary Section of this disclosure, for example, it is understood that the term "loads" as used herein may refer to any source, any component, any element and any process.

In embodiments, the parameters, processes, conditions or equipment are dynamically controlled by a control system associated with the electrical system. In embodiments, the control system may correspond to or include one or more of the IEDs 121, 122, 123, 124 in the electrical system, central processing unit 140 and/or other devices within or external to the electrical system.

Figure 2:
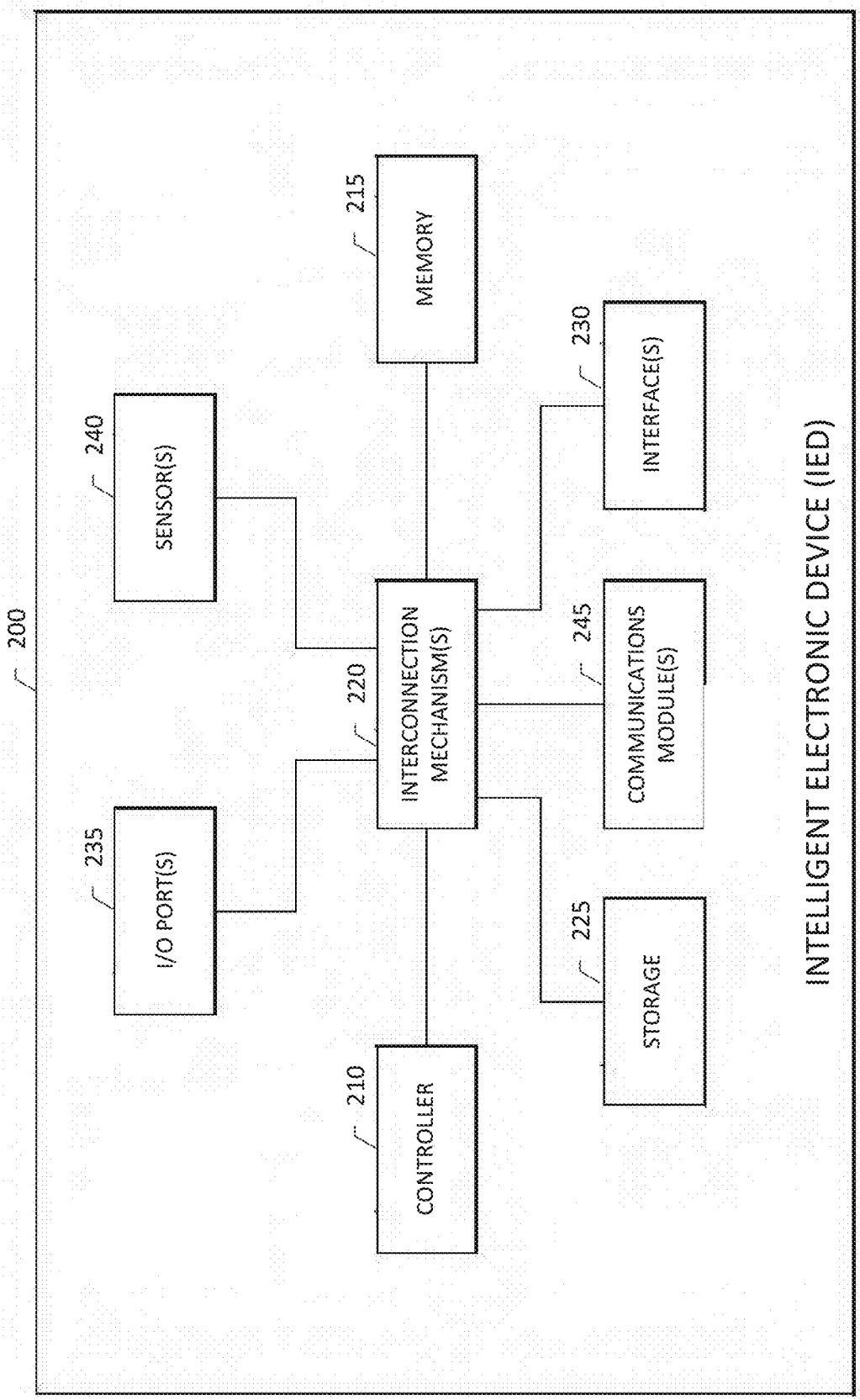
FIG. 2 shows an example intelligent electronic device (IED) that may be used in an electrical system in accordance with embodiments of the disclosure.

Referring to FIG. 2, an example IED 200 that may be suitable for use in the electrical system shown in FIG. 1, for example, includes a controller 210, a memory device 215, storage 225, and an interface 230. The IED 200 also includes an input-output (I/O) port 235, a sensor 240, a communication module 245, and an interconnection mechanism 220 for communicatively coupling two or more IED components 210-245.

The memory device 215 may include volatile memory, such as DRAM or SRAM, for example. The memory device 215 may store programs and data collected during operation of the IED 200. For example, in embodiments in which the IED 200 is configured to monitor or measure one or more electrical parameters associated with one or more loads (e.g., 111, shown in FIG. 1) in an electrical system, the memory device 215 may store the monitored electrical parameters.

The storage system 225 may include a computer readable and writeable nonvolatile recording medium, such as a disk or flash memory, in which signals are stored that define a program to be executed by the controller 210 or information to be processed by the program. The controller 210 may control transfer of data between the storage system 225 and the memory device 215 in accordance with known computing and data transfer mechanisms. In embodiments, the electrical parameters monitored or measured by the IED 200 may be stored in the storage system 225.

The I/O port 235 can be used to couple loads (e.g., 111, shown in FIG. 1) to the IED 200, and the sensor 240 can be used to monitor or measure the electrical parameters associated with the loads. The I/O port 235 can also be used to coupled external devices, such as sensor devices (e.g., temperature and/or motion sensor devices) and/or user input devices (e.g., local or remote computing devices) (not shown), to the IED 200. The external devices may be local or remote devices, for example, a gateway (or gateways). The I/O port 235 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 200.

The communication module 245 may be configured to couple the IED 200 to one or more external communication networks or devices. These networks may be private networks within a building in which the IED 200 is installed, or public networks, such as the Internet. In embodiments, the communication module 245 may also be configured to couple the IED 200 to a cloud-connected hub (e.g., 130, shown in FIG. 1), or to a cloud-connected central processing unit (e.g., 140, shown in FIG. 1), associated with an electrical system including IED 200.

The IED controller 210 may include one or more processors that are configured to perform specified function(s) of the IED 200. The processor(s) can be a commercially available processor, such as the well-known Pentium™, Core™, or Atom™ class processors available from the Intel Corporation. Many other processors are available, including programmable logic controllers. The IED controller 210 can execute an operating system to define a computing platform on which application(s) associated with the IED 200 can run.

In embodiments, the electrical parameters monitored or measured by the IED 200 may be received at an input of the controller 210 as IED input data, and the controller 210 may process the measured electrical parameters to generate IED output data or signals at an output thereof. In embodiments, the IED output data or signals may correspond to an output of the IED 200. The IED output data or signals may be provided at I/O port(s) 235, for example. In embodiments, the IED output data or signals may be received by a cloud-connected central processing unit, for example, for further processing (e.g., to monitoring energy-related data in an electrical system, as will be discussed further below), and/or by equipment (e.g., loads) to which the IED is coupled (e.g., for controlling one or more parameters associated with the equipment, as will be discussed further below). In one example, the IED 200 may include an interface 230 for displaying visualizations indicative of the IED output data or signals. The interface 230 may correspond to a graphical user interface (GUI) in embodiments.

Components of the IED 200 may be coupled together by the interconnection mechanism 220, which may include one or more busses, wiring, or other electrical connection apparatus. The interconnection mechanism 220 may enable communications (e.g., data, instructions, etc.) to be exchanged between system components of the IED 200.

It is understood that IED 200 is but one of many potential configurations of IEDs in accordance with various aspects of the disclosure. For example, IEDs in accordance with embodiments of the disclosure may include more (or fewer) components than IED 200. Additionally, in embodiments one or more components of IED 200 may be combined. For example, in embodiments memory 215 and storage 225 may be combined.

Referring to FIGS. 3-7, flowcharts (or flow diagrams) and other figures are shown to illustrate various methods (here, methods 300, 600) and aspects of the disclosure for monitoring energy-related data in an electrical system. Rectangular elements (typified by element 305 in FIG. 3) in the flowcharts, as may be referred to herein as "processing blocks," may represent computer software and/or IED algorithm instructions or groups of instructions. Diamond shaped elements (typified by element 315 in FIG. 3), as may be referred to herein as "decision blocks," represent computer software and/or IED algorithm instructions, or groups of instructions, which affect the execution of the computer software and/or IED algorithm instructions represented by the processing blocks. The processing blocks and decision blocks (and other blocks shown) can represent steps performed by functionally equivalent circuits such as a digital signal processor circuit or an application specific integrated circuit (ASIC).

Figure 6:
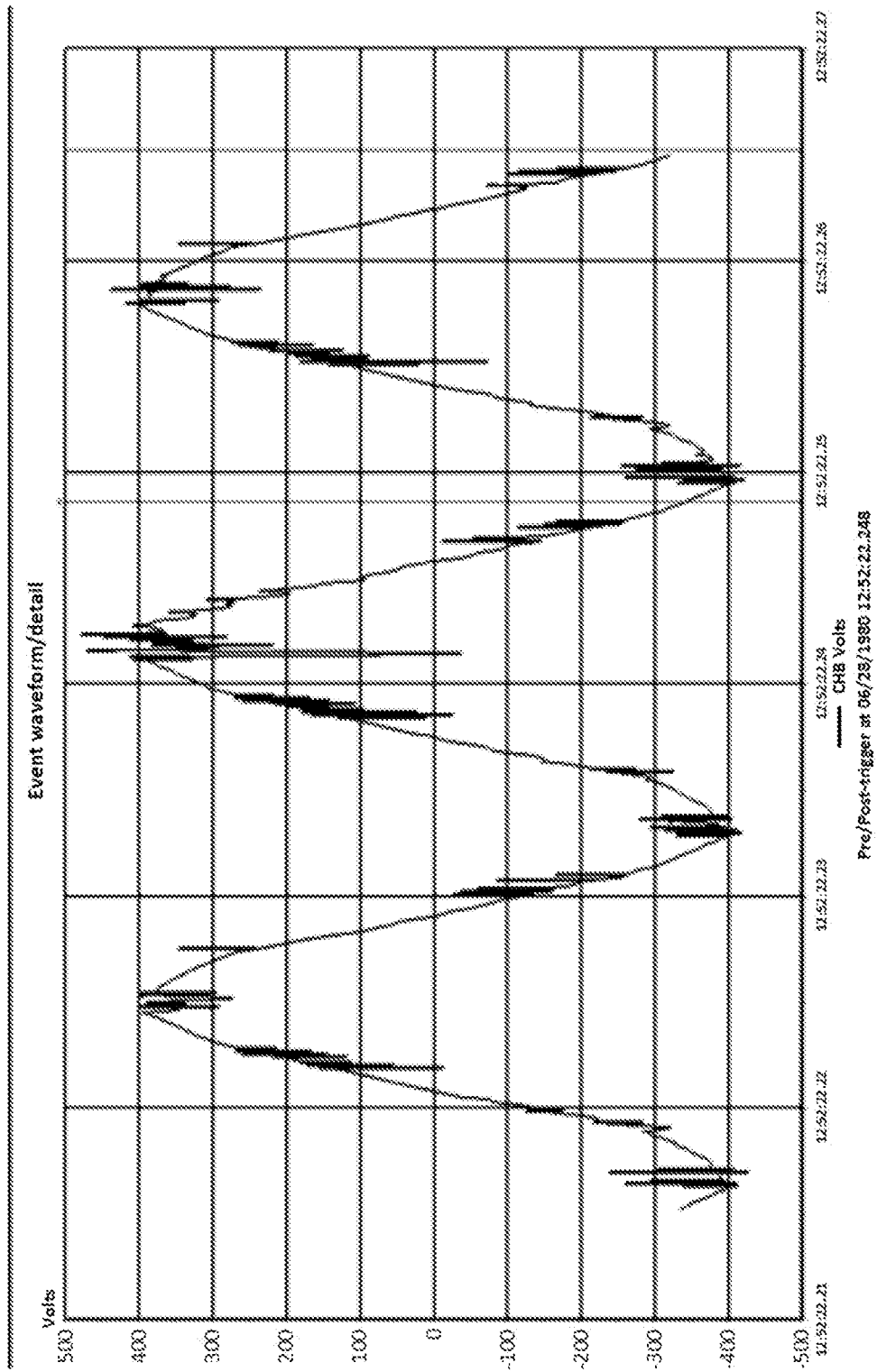
FIG. 6 shows an example of an aggregated signal with multiple downstream loads.

The flowcharts do not depict the syntax of any particular programming language. Rather, the flowcharts illustrate the functional information one of ordinary skill in the art requires to fabricate circuits or to generate computer software and algorithms to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with monitoring energy-related data in an electrical system sought to be protected by this disclosure. It is also understood that various features from the flowcharts described below may be separated in some embodiments. For example, while the flowcharts illustrated in FIGS. 3 and 6 are shown having many blocks, in some embodiments the illustrated method shown by these flowcharts may include fewer blocks or steps.

Figure 3:
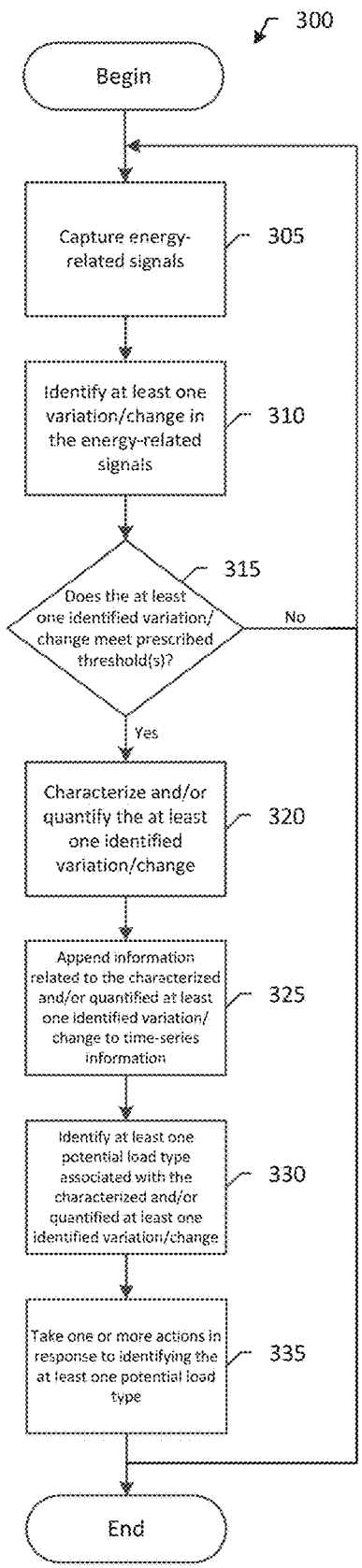
FIG. 3 is a flowchart illustrating an example implementation of a method for monitoring energy-related data in an electrical system.

Referring to FIG. 3, a flowchart illustrates an example method 300 for monitoring energy-related data in an electrical system. The electrical system, which may be the same as or similar to the electrical system shown in FIG. 1, for example, may be associated with at least one facility and/or at least one operation in some embodiments. The at least one facility (which may include one or more buildings) and/or the at least one operation may be associated with at least one process (e.g., manufacturing process, such as a painting process, automobile assembly process, and/or another device assembly process) and/or at least one application, and include one or more of a plurality of load types. The plurality of load types may include machinery, apparatuses and/or components associated with the particular process(es) and/or application(s), for example.

In accordance with embodiments of this disclosure, method 300 may be implemented, for example, on a processor of at least one IED (e.g., 121, shown in FIG. 1) and/or remote from the at least IED, for example, in at least one of: a cloud-based system, on-site/edge software, a gateway, or another head-end system. The at least one IED and/or the at least one other system and/or device on which the method 300 is implemented, may be associated with (e.g., be electrically and/or communicatively coupled to) the electrical system.

As illustrated in FIG. 3, the method 300 begins at block 305, where energy-related signals (or waveforms) are measured and data is captured, collected, accumulated, stored, etc. by at least one IED (and/or control system) in the electrical system. The at least one IED may be installed or located, for example, at a respective metering point of a plurality of metering points in the electrical system. In some embodiments, the at least one IED may be coupled to one or more loads/equipment/apparatuses in the electrical system, and the energy-related signals measured may be associated with the loads to which the at least one IED is coupled. It is understood that the energy-related signals may be collected from at least one or more loads and/or non-loads such as control system(s) and sensor device(s) (e.g., for I/O status information).

The energy-related signals may include, for example, at least one of: a voltage signal, a current signal, I/O data, and a derived energy-related value. In some embodiments, the I/O data includes at least one of on/off status(es), open/closed status(es), high/low status(es), temperature(s), pressure(s), and volume(s). Additionally, in some embodiments the derived energy-related value a voltage signal, a current signal, and a derived energy-related value. In some embodiments, the derived energy-related value includes at least one of: a calculated, computed, estimated, derived, developed, interpolated, extrapolated, evaluated, and otherwise determined additional energy-related value from the at least one of the voltage signal and/or the current signal. In some embodiments, the derived energy-related value includes at least one of: active power(s), apparent power(s), reactive power(s), energy(ies), harmonic distortion(s), power factor(s), magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase current(s), phase angle(s), impedance(s), sequence component(s), total voltage harmonic distortion(s), total current harmonic distortion(s), three-phase current(s), phase voltage(s), line voltage(s) and/or other similar/related parameters. In some embodiments, the derived energy-related value includes at least one energy-related characteristic, the energy-related characteristic including magnitude, direction, phase angle, percentage, ratio, level, duration, associated frequency components, impedance, energy-related parameter shape, and/or decay rate. It is understood that many other derived energy-related value(s) are possible, as will be apparent to one of ordinary skill in the art.

At block 310, energy-related data from, or derived from, the energy-related signals (e.g., voltage and/or current signals, I/O data, etc.) captured at block 305 is processed to identify at least one variation/change (e.g., in voltage, current, kW, harmonics, etc.) in the energy-related signals. In some embodiments, the at least one identified variation/change is an instantaneous or contemporaneous variation/change in the energy-related signals. Additionally, in some embodiments the at least one identified variation/change is a longer-term variation/change in the energy-related signals. For example, the at least one identified variation/change may correspond at least one identified variation/change in the energy-related signals over a particular time period. The variation/change may be tracked over the particular time period, for example.

Changes in the signals provide distinguishing/distinctive attributes of loads. This helps to identify what the load(s) is/are in the electrical system. Load type identification is discussed further below. However, let it suffice here to say that increases in the current total harmonic distortion (THD) may indicate a non-linear load has been energized. Additionally, increases in specific harmonic currents (e.g., $5^{th}$, $7^{th}$, $11^{th}$, $13^{th}$, etc.) may indicate a three-phase variable speed drive has been energized. In general, every change in the signal signifies some important factor that can be used to identify a load type, as will be appreciated from further discussions below.

At block 315, it is determined if the at least one identified variation/change meets a prescribed threshold or thresholds. In accordance with some embodiments of this disclosure, the prescribed threshold or thresholds is or are a predetermined threshold or thresholds. For example, the prescribed threshold or thresholds may set by an end-user and/or a system operator. For example, the end-user and/or system operator may set the prescribed threshold or thresholds such that any changes less than 5 kW are ignored.

In other embodiments, the prescribed threshold(s) may be a dynamic threshold(s). The dynamic threshold(s) may change, for example, in response to changes in the electrical system. For example, the at least one IED and/or other systems and/or devices in the electrical system may detect changes in the electrical system (e.g., devices being added to and/or removed from the electrical system), and the dynamic threshold or thresholds may change in response to the detected changes. In some instances which involve multiple thresholds (predetermined thresholds and/or dynamic thresholds), at least one of the thresholds may correspond to an upper threshold and at least one of the thresholds may correspond to a lower threshold. It is understood that a threshold may encompass a range of values in some instances.

For example, using the non-linear load example discussed above, thresholds might be set for specific harmonics or groups of harmonics to identify a load. Triplen harmonics (i.e., harmonics that are a multiple of 3 . . . $3^{rd}$, $6^{th}$, $9^{th}$, $12^{th}$, $15^{th}$, etc.) often indicate a single-phase non-linear load; therefore, thresholds or other indicators may be set on these specific harmonic current components to indicate that a non-linear load has been energized or de-energized. Non-linear loads without significant changes in the triplen harmonic currents tend to indicate a three-phase non-linear load has been energized or de-energized.

In cases such as the aforesaid, focus may be on the triplen harmonic currents to determine that a non-linear single-phase load has been energized or de-energized. However, the focus may be on non-triplen odd harmonic current frequencies to determine that a three-phase non-linear load has been energized or de-energized. In this case (three-phase, non-linear loads), significant changes in the non-triplen odd harmonic currents (e.g., $5^{th}$, $7^{th}$, $11^{th}$, $13^{th}$, $17^{th}$, $19^{th}$, etc.) may be evaluated. Additionally, insignificant changes on the triplen harmonic currents may be identified because those signify a single-phase non-linear load being energized/de-energized.

Returning now to block 315, if it is determined that the at least one identified variation/change meets a prescribed threshold or thresholds, the method proceeds to block 320. Alternatively, if is determined that the at least one identified variation/change does not meet the prescribed threshold or thresholds, the method may either return to block 305 (for further capturing and processing of energy-related signals) or end. For example, in embodiments in which it is desirable to continuously (or semi-continuously) capture energy-related signals and to dynamically identify and track variations/changes in energy-related signals, the method may return to block 305. Alternatively, in embodiments in which it is desirable to characterize (and respond to) variations/changes identified in a single set of captured energy-related signals, the method may end.

At block 320, the at least one identified variation/change may be characterized and/or quantified in response to the at least one identified variation/change meeting the prescribed threshold or thresholds. In some embodiments, characterizing and/or quantifying the at least one identified variation/change includes identifying what changed and to what degree it changed. For example, current distortion changes may be identified and quantified (e.g., % of current distortion, amperes of current distortion, etc.).

At block 325, information related to the characterized and/or quantified at least one identified variation/change may be appended to time-series information associated with the energy-related data. For example, the time-series information may be tagged with indications, metadata, characteristics and/or other information related to the characterized and/or quantified at least one identified variation/change. For example, referring briefly to FIG. 4, information such as "Non-linear load turned on", "50 kW real power increase" and "Three-phase harmonic current distortion increase (amps)" may be appended to time-series information associated with the energy-related data. Additionally, information such as "Linear Load energized," "25 kW real power increase," "Single-phase reactive power increase (kVArs)," and "Single-phase PF decrease (%)" may be appended to the time-series information.

Returning now to FIG. 3, at block 330, characteristics and/or quantities associated with the time-series information are evaluated to identify at least one potential load type associated with the characterized and/or quantified at least one identified variation/change. In accordance with some embodiments of this disclosure, the at least one identified potential load type corresponds to or includes at least one subset of load types in the electrical system. For example, as discussed previously in this disclosure, in some instances the electrical system may include a plurality of load types (e.g., load types A, B, C, D, etc.). In accordance with some embodiments of this disclosure, the at least one identified potential load type corresponds to or includes one or more of the plurality of load types (e.g., load type A and/or load type B). Further, each load type of the at least one identified potential load type may include a single load or an aggregation of two or more loads. In other words, in instances when the at least one identified potential load type corresponds to or includes a single load type (e.g., load type A), the single load type may be determined to include a single load or a plurality of loads (e.g., based on an analysis of the energy-related signals captured at block 305).

Figure 5:
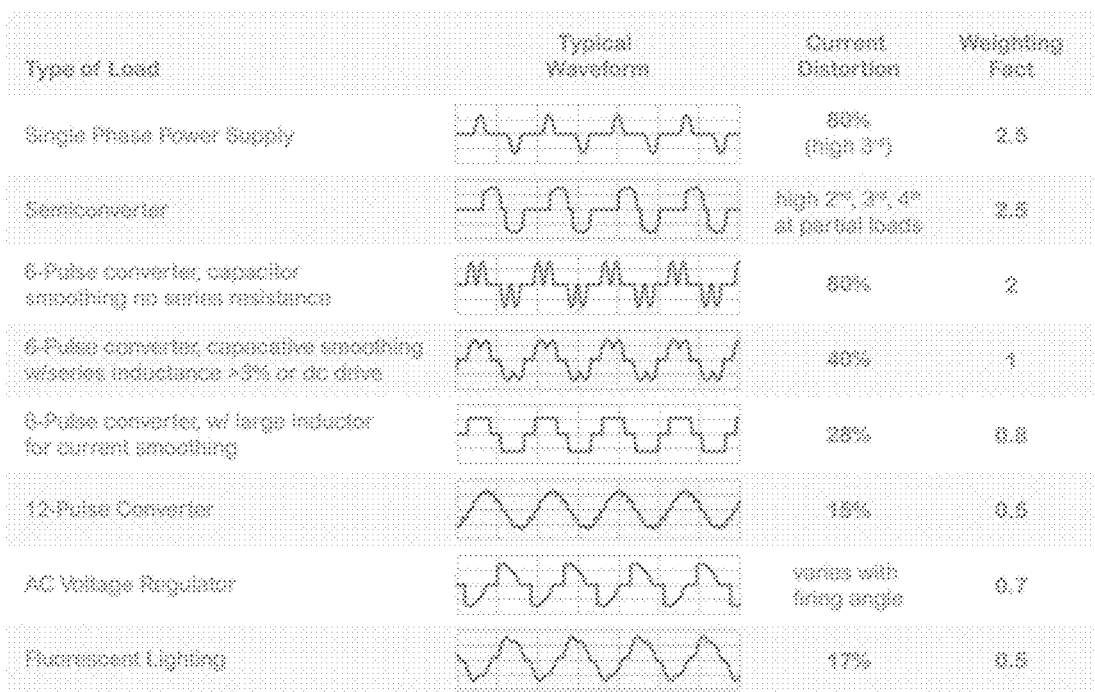
FIG. 5 shows an example of current characteristics associated with various non-linear loads.

In accordance with some embodiments of this disclosure, the at least one potential load type is identified or selected from a plurality of potential loads types in a library of load types and associated start/run/change/stop characteristics. For example, characteristics and/or quantities associated with the time-series information may be compared with characteristics and/or quantities associated with the plurality of potential loads types in the library of load types and associated start/run/change/stop characteristics to identify the at least one potential load type. Referring briefly to FIG. 5, in accordance with some embodiments of this disclosure, the library of load types and associated start/run/change/stop characteristics may include signal characteristics (e.g., typical waveforms) and other related information (e.g., current distortion on specific frequency components, reactive VArs consumed by the load, imbalanced loads, etc.) such as those shown in FIG. 5. In some instances, the signal characteristics and other related information may be compared with the characteristics and/or quantities associated with the time-series information to identify the at least one potential load type. It is understood that the signal characteristics and other related information shown in FIG. 5 are merely illustrative of example types of information that may be included in the library of load types and associated start/run/change/stop characteristics. The library of load types and associated start/run/change/stop characteristics may, of course, include additional and/or other types of information. In one particular embodiment, each load may also have associated typical "load levels". These load levels would be deduced from typical "run" modes and analysing by using state of the art algorithms (e.g., clustering using K-means, Density-based spatial clustering of applications with noise (DBSCAN), Model-based clustering or time series clustering or any other discriminating and/or grouping algorithm). Accordingly, each load would not only be identified, but would also have additional characteristics associated to it such as the running "load level".

The library of load types and associated start/run/change/stop characteristics may be stored on and accessed by at least one memory device associated with the electrical system, for example. In some embodiments, the at least one memory device includes or corresponds to at least one memory device of the at least one IED (and/or control system) responsible for capturing the energy-related signals at block 305. In some embodiments, the library of load types and associated start/run/change/stop characteristics may initially be generated in response to user input (e.g., using user provided data), evaluating energy-related signals, and be updated using machine learning techniques, for example, as discussed further below in connection with FIG. 7.

It is understood that the characteristics of the aggregation of one or more load types may be unique to the end-user's electrical system and/or their way of operating the system. These system and/or operational traits are of interest to help characterize the load types, either through customer input, learning, and/or comparison to the library content, for example.

Referring briefly to FIG. 6, shown is an example aggregated signal with multiple downstream loads to help illustrate how a plurality of loads of the same load type may be identified at block 330. The waveform exhibits a single-phase voltage signal for multiple (21) variable speed drives (VSDs) used in an extrusion process to make plastic bags. The notches shown in the waveform are produced by the 21 six-pulse controlled rectifiers on the front-end of the VSDs. When the drive controls turn-on the controlled rectifier's thyrisor/SCR, a low-impedance phase to the load occurs resulting in a notch into the voltage waveform. Six-pulse controlled rectifiers generally "fire" each thyristor/SCR twice per cycle per phase to provide and control energy to the DC motor being driven; hence the term "six-pulse drive."

While it may be difficult to completely disaggregate the number of downstream VSD loads due to overlapping notches in this case, it is possible to determine an approximate number of downstream VSDs by evaluating the number of notches in the voltage signal as it corresponds to the current signal. The harmonic frequencies associated with the downstream (downline) loads also provides further validation of three-phase non-linear loads.

Figure 4:
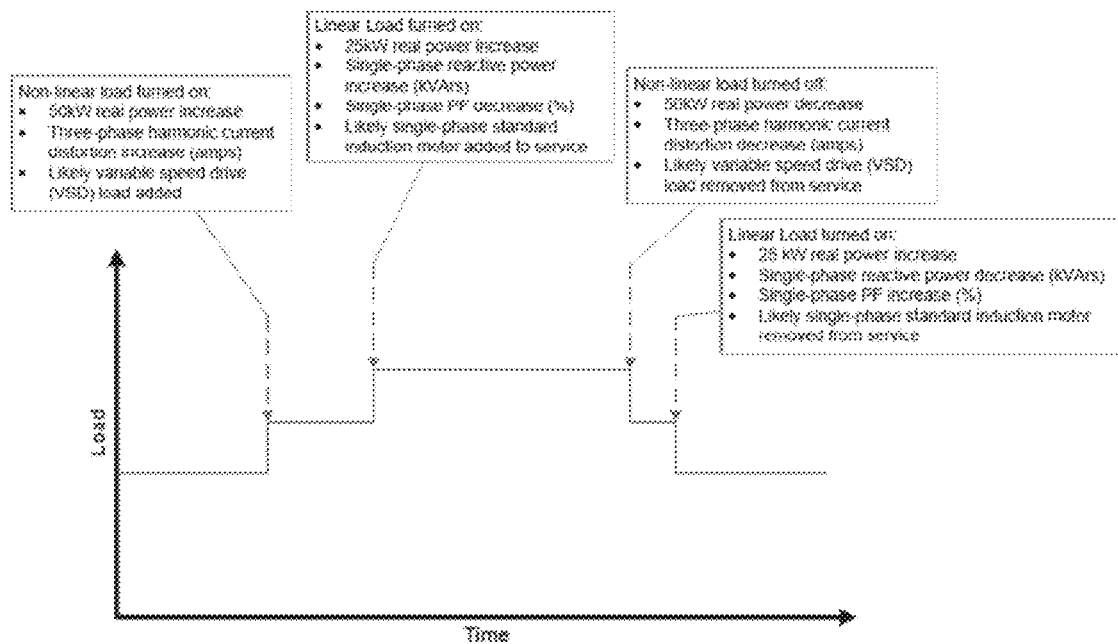
FIG. 4 shows a known example of evaluating load characteristics based on changes in energy-related signals.

Returning now to method 300, at block 335, one or more actions may be taken in response to identifying the at least one potential load type. For example, the one or more actions may include providing an indication of the identified at least one potential load type. In some embodiments, the indication is communicated to an end-user, equipment manufacturer, and/or services team. In accordance with embodiments of this disclosure, the communication may include, for example, at least one of: a report, a text, an email, audibly, and an interface of a screen/display (e.g., a display device of a computing device or system associated with the electrical system). The report, text, etc. may indicate the likely at least one potential load type. For example, referring again briefly to FIG. 4, information such as "Likely VSD load added" and "Likely single-phase standard induction motor added to service" may be indicated in the report, text, etc. As illustrated in FIG. 4, the report, text, etc. may include the time-series information associated with the energy-related data in some instances (this could also be considered as a "derived time series", such as the "start phase", "running with 50% load level", "turning off", "off" status indications aka "change points" as events inside the time series). In accordance with some embodiments of this disclosure, the report, text, etc. may additionally or alternatively present any issues associated with the at least one identified potential load type. The report, text, etc. may present priority and/or severity of the issues. Additionally, the report, text, etc. may provide actionable recommendations for responding to the issues.

Another example action that may be taken in response to identifying the at least one potential load type includes directly or indirectly controlling at least one component (e.g., piece of equipment) in the electrical system in response to identifying the operational status (on/off) of the at least one potential load type. For example, at least one parameter (e.g., on-off power state) associated with the at least one component may be controlled or adjusted in response to identifying the at least one potential load type to prevent or reduce damage to electrical system equipment or to increase performance of the electrical system equipment. The parameter may be controlled, for example, in response to a control signal received from an IED of the at least one IED and/or to a control signal received from a control system, for example. The control system may be communicatively coupled to the at least one IED, and/or to a cloud-based system, on-site software, a gateway, and another head-end/edge system associated with the electrical system, for example.

Subsequent to block 335, the method may end in some embodiments. In other embodiments, the method may return to block 305 and repeat again (for substantially the same reasons discussed above in connection with block 315, or due to some updated status and/or condition in with respect to a load, loads, process, processes, etc.). In some embodiments in which the method ends after block 335, the method may be initiated again in response to user input and/or a control signal, for example.

It is understood that method 300 may include one or more additional blocks or steps in some embodiments. For example, in some embodiments method 300 may include developing a confidence factor that the identified at least one potential load type is the actual load type. In one example implementation, the confidence factor may be developed based on how closely the characteristics and/or quantities associated with the time-series information match characteristics and/or quantities associated with a selected at least one potential load type. As discussed above, the selected at least one potential load type may be selected from a plurality of potential load types listed in a library of load types and associated start/run/change/stop characteristics. In accordance with some embodiments of this disclosure, the confidence factor may additionally or alternatively be developed from input provided by an end-user to validate the load type(s). The confidence factor may be communicated to the end-user, equipment manufacturer, and/or services team (e.g., via a text, report, etc.), as few examples. In accordance with some embodiments of this disclosure, the communicated confidence factor may be updated, for example, in response to user input. The user input may include, for example, a user selection of the identified at least one potential load type from a list of a plurality of possible load types and/or user validation of the identified at least one potential load type, as a few examples. Justifications/reasons for the confidence factor may also be communicated. For example, a confidence level associated with the confidence factor may be communicated. For example, it may be communicated that there is a high confidence of downstream (downline) non-linear three-phase loads such as VSDs based on the minimal triplen harmonics.

Other example aspects of this invention are described in connection with figures below.

Figure 7:
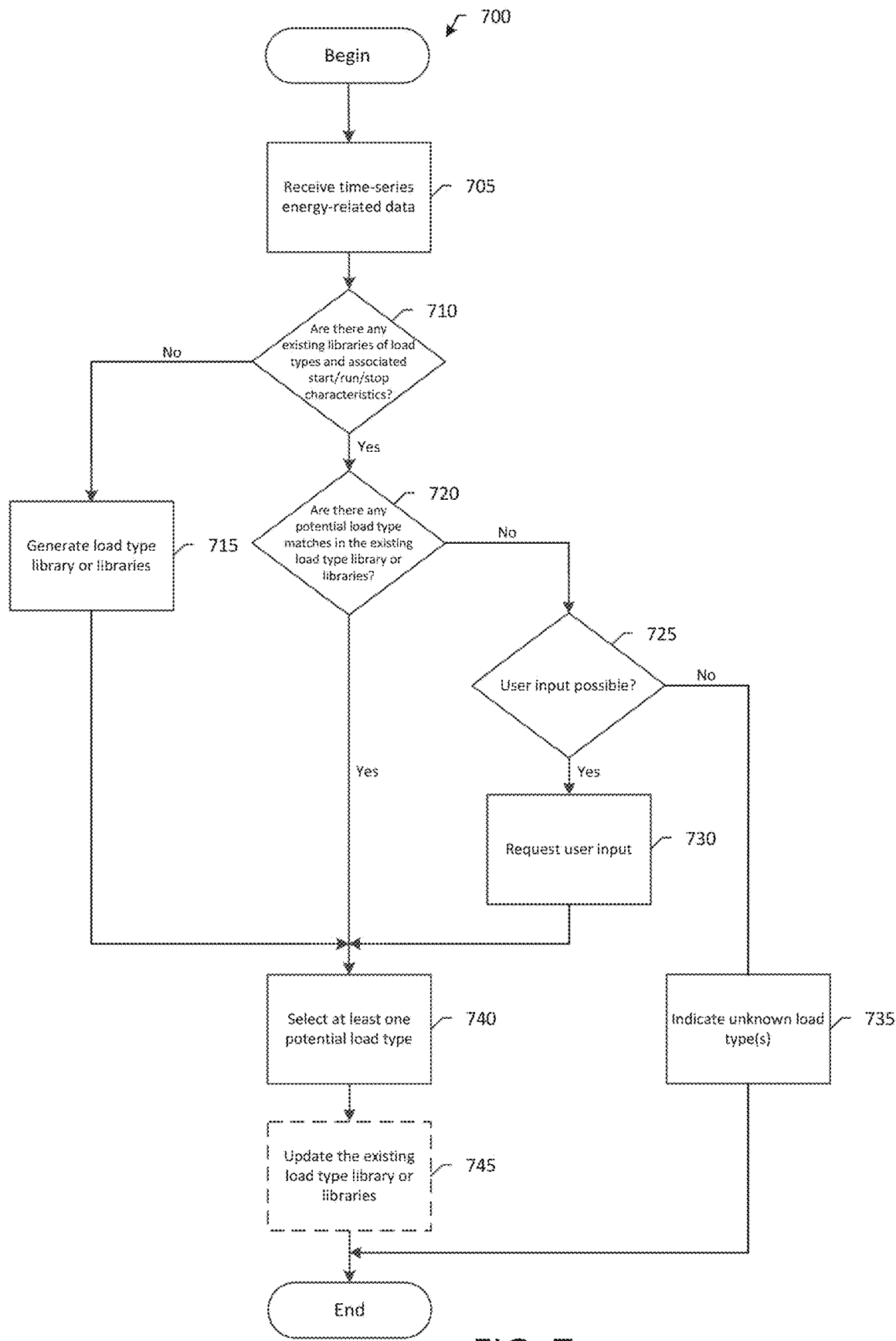
FIG. 7 is a flowchart illustrating an example implementation of a method for identifying or selecting at least one potential load type, and characterizing operations of a power system and its associated components.

Referring to FIG. 7, a flowchart illustrates an example method 700 for identifying or selecting at least one potential load type. In accordance with embodiments of this disclosure, method 700 corresponds to example steps that may be performed at block 330 of method 300 discussed above in connection with FIG. 3.

As illustrated in FIG. 7, the method 700 begins at block 705, where time-series energy-related data is received, for example, at an input of an IED and/or another system and/or device (e.g., control system) on which the method 700 is implemented. In accordance with embodiments of this disclosure, the time-series energy-related data corresponds to the data generated or otherwise provided at block 325 of method 300. As noted above in connection with method 300, the time-series energy-related data is associated with energy-related data from, or derived from, the energy-related signals (e.g., voltage and/or current signals, I/O data, etc.) captured at block 305 of method 300.

At block 710, it is determined if there are any existing libraries of load types and associated start/run/change/stop characteristics. As discussed above in connection with FIG. 3, in accordance with some embodiments of this disclosure, at block 330 of method 300 the at least one potential load type associated with the characterized and/or quantified at least one identified variation/change may be selected from (or matched to) a library of load types and associated start/run/change/stop characteristics. In method 700, if it is determined there are existing libraries of load types and associated start/run/change/stop characteristics, the method 700 may proceed from block 710 to block 720. Alternatively, if it is determined there are no existing libraries of load types and associated start/run/change/stop characteristics, the method may proceed from block 710 to block 715.

At block 715, at least one library of load types and associated start/run/change/stop characteristics may be generated, for example, based on the time-series energy-related data. In some embodiments, the at least one library of load types and associated start/run/change/stop characteristics is generated in response to user-input. Additionally, in some embodiments the at least one library of load types and associated start/run/change/stop characteristics is automatically or semi-automatically generated in response to input data (e.g., the time-series energy-related data, I/O data, etc.). Subsequent to block 715, the method 700 may proceed to block 740, as will be discussed further below.

Returning now to block 720, at block 720 it may be determined if there are any potential load type matches in the existing library or libraries of load types and associated start/run/change/stop characteristics. If it is determined there are potential load type matches in the existing library or libraries of load types and associated start/run/change/stop characteristics, the method 700 may proceed to block 740. Alternatively, if it is determined there are no potential load type matches in the existing library or libraries of load types and associated start/run/change/stop characteristics, the method 700 may proceed to block 725.

At block 725, it may be determined if input from a user (or users) is possible (e.g., for assisting with selecting at least one potential load type). In one example implementation, the user(s) could be a physical person (or persons). In another example implementation, the user(s) could additionally or alternatively be another system such as a SCADA or a Building management system (e.g., utilizing artificial intelligence). If it is determined user input is possible, the method 700 may proceed to block 730 where user input is requested, for example, through a text, email, signal and/or other form of indication. The text, email, signal, etc. may be received by an end-user (e.g., physical person) and/or system operation (e.g., SCADA or a building management system), for example. In one embodiment, several inputs may be provided, for example, by one user if this user has several potential answers (such as, for example, when several loads started or stopped at the same time, which may assist with selecting the at least one potential load type). In another embodiment, an input or inputs may be provided by multiple users (e.g., physical or otherwise). If it is determined user input is not possible, or the user(s) does/do not wish to provide input(s) at this time (e.g., the user(s) needs to investigate further before providing input, does not have time to provide input, etc.), the method 700 may proceed to block 735 where an indication or notification is provided that the load type(s) is/are unknown. Similar to above, the indication may take the form of a text, email, and/or other form of indication. Subsequent to block 735, the method 700 may end in some embodiments.

Returning now to block 740, at block 740 at least one potential load type may be selected or identified. In some embodiments, the at least one potential load type is selected based on matching criteria between the time-series energy-related data and data in the library or libraries of load types and associated start/run/change/stop characteristics (e.g., such as the data shown in FIG. 5). Additionally, in some embodiments the at least one potential load type is selected in response to or based on user input (e.g., in response to the request sent at block 730). It is understood that more than one potential load type may be selected at this time, or the system may select additional load types in future iterations of the process.

At block 745, which is optional in some embodiments, the existing library or libraries of load types and associated start/run/change/stop characteristics may be updated. For example, the existing library or libraries of load types and associated start/run/change/stop characteristics may be updated based on an analysis of a number of learned factors or criteria (e.g., using machine learning techniques, user updates, etc.). For example, the library or libraries of load types and associated start/run/change/stop characteristics may be updated based on information learned from the time-series energy-related data received at block 705 and/or other input data. In accordance with some embodiments of this disclosure, the other input data (e.g., data about loads and/or the electrical system) may be received from one or more data sources. The data sources may include, for example, sensors and/or other devices in the electrical system. Additionally, the data sources may include end-users and/or system operators, for example. The end-users and/or system operators may teach or train the system(s) and/or device(s) responsible for generating the library or libraries of load types and associated start/run/change/stop characteristics, for example, using training data (e.g., sample time-series energy-related data and other relevant information).

At block 745, information associated with identifying the at least one potential load type may also be saved to at least one memory device for future analyses/uses (i.e., other analyses/uses besides generating or updating libraries of load types and associated start/run/change/stop characteristics). The future analyses/uses may include, for example, data disaggregation, data aggregation, operational trends, consumption trends, use trends (i.e., how long a piece of equipment has been installed), data constraints, metering gaps, as a few examples. Another example of future analyses/uses may be illustrated by events analysis, where the "potential load type(s)" defined at block 740 may provide contextual information useful for determining what has happened when, for instance, when alarm flooding (e.g., according to ISA 18.2) (i.e., inundate) impacts the system/user (e.g., switching, impacts, and/or any other indication). Another example of future analyses/uses may be related to asset management. For example, when a load or group of loads is identified at block 740, and the different operational stable running modes are identified at block 330 of method 300, one may execute condition-based monitoring algorithms to detect changes or trends to indicate when to perform maintenance, and potentially providing a diagnosis of potential causes/issues, impacts or risks if not action is taken. All of these actions may be based on the inputs provided by this method/application (i.e., the subject matter of this disclosure). Many additional fields of analysis may benefit from this manner of load identification (e.g., energy management overconsumptions or potential savings analysis, power flows analysis, simulations of switching to other sources, load shedding analysis, and this list is there only to illustrate the breadth of possible applications).

In accordance with embodiments of this disclosure, the information stored for future analyses/uses includes at least one of: the at least one identified variation/change, the characterized and/or quantified at least one identified variation/change, the time-series information, and the evaluated characteristics and/or quantities associated with the time-series information. The at least one memory device on which the information associated with identifying the at least one potential load type may be stored may correspond to or include, for example, the at least one IED responsible for capturing the energy-related signals in method 300, and/or any other relevant system and/or device in the electrical system.

Subsequent to block 745, the method may end in some embodiments. In other embodiments, the method may return to block 705 and repeat again (e.g., in response to receiving additional time-series energy-related data at block 705). In some embodiments in which the method ends after block 745, the method may be initiated again in response to user input, timer and/or a control signal, for example.

Figure 8A:
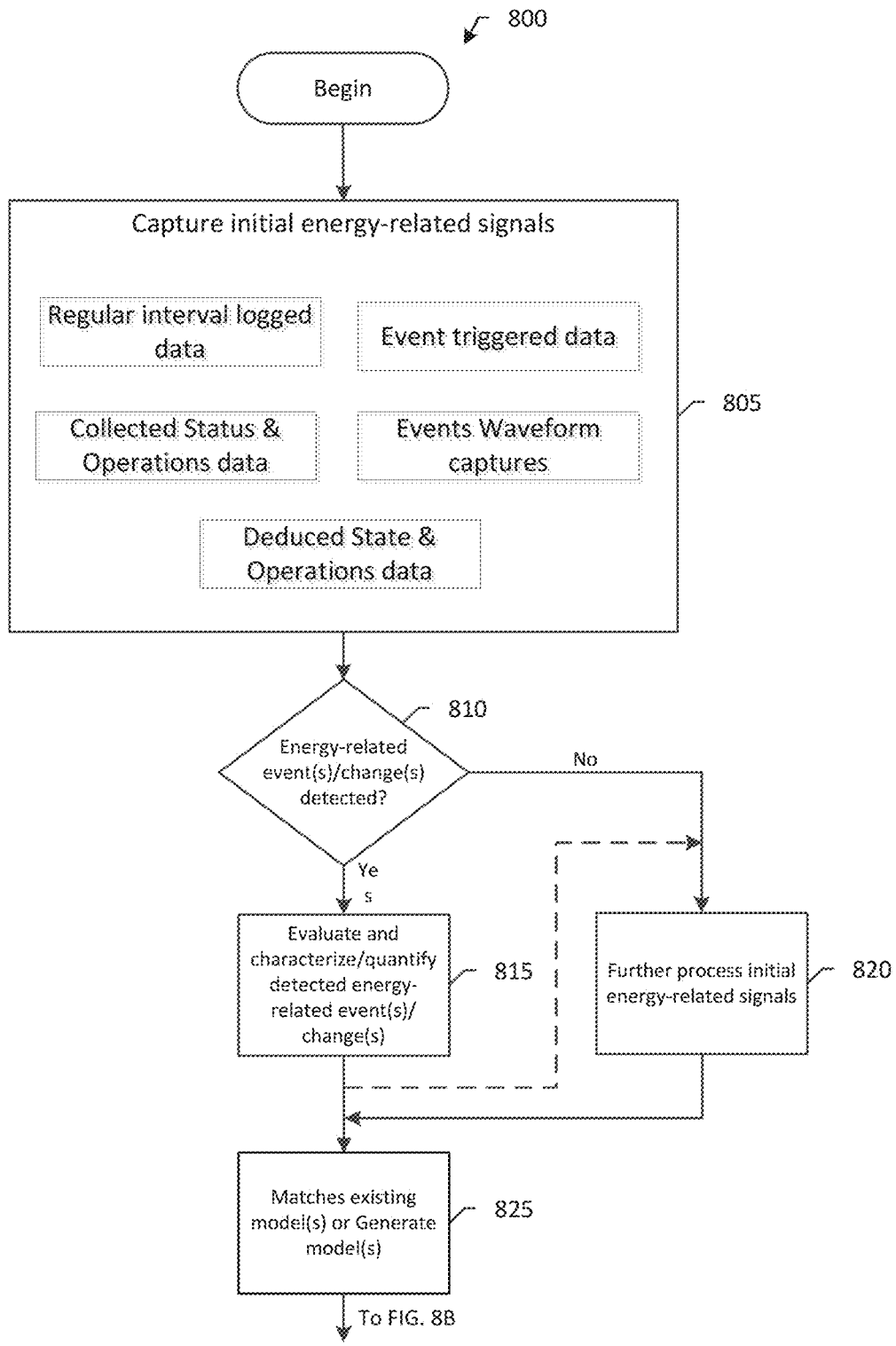
FIGS. 8A and 8B show a flowchart illustrating another example implementation of a method for monitoring energy-related data in an electrical system.
Figure 8B:
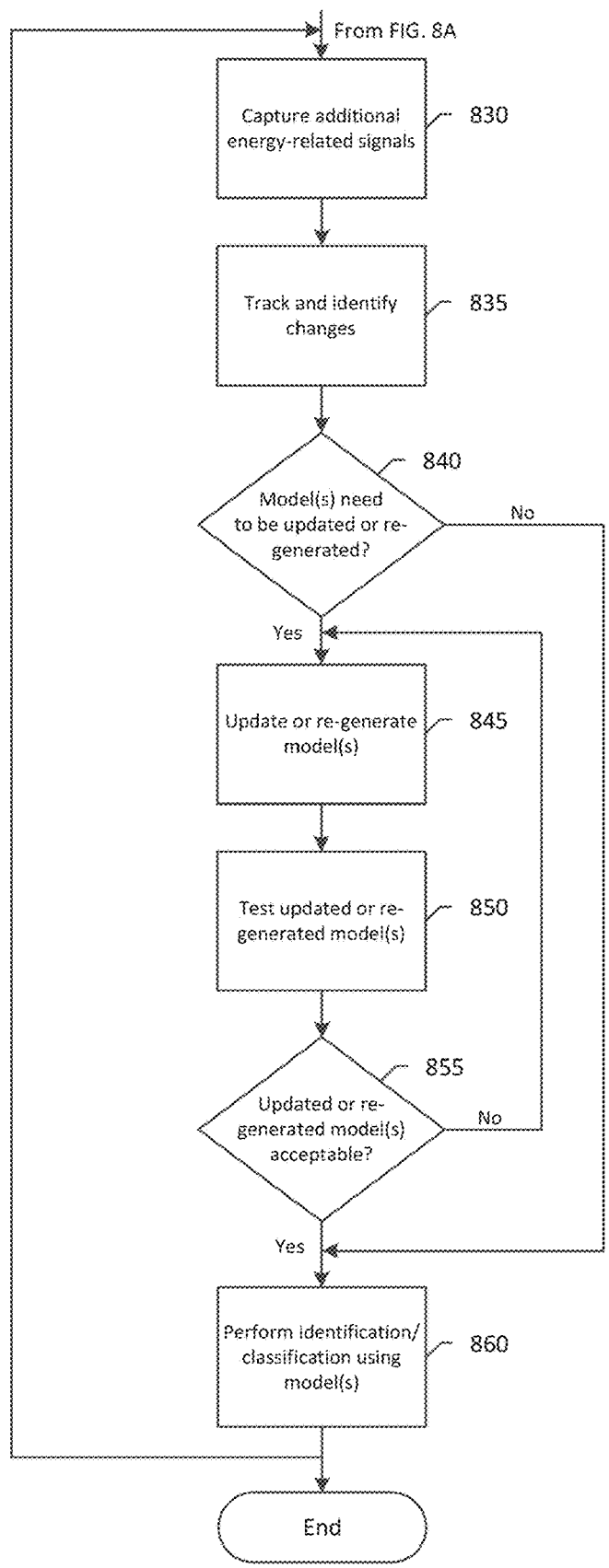

Referring to FIGS. 8A and 8B, a flowchart illustrates another example method 800 for monitoring energy-related data in an electrical system. Similar to method 300 and to method 700, method 800 may be implemented, for example, on a processor of at least one IED (e.g., 121, shown in FIG. 1) and/or remote from the at least IED, for example, in at least one of: a cloud-based system, on-site software/edge, a gateway, or another head-end system.

In accordance with some embodiments of this disclosure, method 800 corresponds to an example implementation of method 300 and of method 700. For example, in accordance with some embodiments of this disclosure, one or more of blocks of method 800 may correspond to example steps performed at various blocks of method 300 and of method 700, as will become further apparent from discussions below.

As illustrated in FIGS. 8A and 8B, the method 800 begins at block 805, where initial energy-related signals (or waveforms) are measured and data is captured, collected, stored, etc. by at least one IED (and/or control system) in the electrical system. In accordance with embodiments of this disclosure, the initial energy-related signals correspond to or comprise part of the energy-related signals measured or otherwise collected at block 305 of method 300, for example. The initial energy-related signals may be captured at a first, initial time (e.g., for generating a baseline/reference model, etc. as will be discussed further below).

As illustrated in FIGS. 8A and 8B, in accordance with some embodiments of this disclosure, the initial energy-related signals may include, for example, at least one of:

regular interval logged data, event triggered data, collected status and operations data, event waveform captures, and deduced state and operations data. In accordance with embodiments of this disclosure, regularly logged/interval data corresponds to measurements which are captured and stored at a regular time interval (e.g., 10 or 15 minutes to match a utility interval, or a smaller interval to have a higher resolution such as 1- or 2-minute intervals to track a specific asset's operational modes). Regularly logged/interval data may include, for example, total or individual power (real, apparent, reactive), voltage, current, harmonic distortion, power factor, and so forth. In some embodiments, these values will be an aggregated or selected type of statistically representative value of this regular time interval (such as the average/mean of this interval, as well as the minimum and maximum values, or $1^{st}$ and $3^{rd}$ quantiles, standard deviation, median value, etc.). These values may also be instantaneous readings/measurements. Event data, for example, can be considered the complementary part of regular interval logged values in the sense that these are logged only when an event was detected. If no alarm is detected, for example, no event data may be logged in some embodiments. When an event is detected, the events data will be time-stamped, and event characteristics will be logged (depending on the events data logging strategy/configurations). The data collection tasks and/or statuses may include, for example, collecting control data (e.g., coming from a building management system (BMS) or a supervisory control and data acquisition (SCADA) system). Additionally, the deduced state and operations data may include, for example, time-series data derived from detected changes.

In one aspect, the initial energy-related signals generally include all regular measurements (e.g., voltage and/or current) as well as all derived/calculated measurements and characteristics (e.g., power factor, event or alarms detection and trigger in IED, triggering a waveform capture, etc.). It is understood that the initial energy-related signals may include many other types of data, as discussed earlier in this disclosure.

At block 810, it is determined if any energy-related events, or changes such as described in block 310 of method 300, are detected in the electrical system based on an analysis of the initial energy-related signals captured at block 805. More particularly, energy-related data from or derived from the initial energy-related signals captured at block 805 is processed to identify/detect energy-related events/changes in the electrical system, and in response thereto it is determined at block 810 if any energy-related events/changes are detected in the electrical system.

In accordance with some embodiments of this disclosure, the energy-related event(s) that may be detected at block 810 include at least one power quality event. It is understood there are types of power quality events and there are certain characteristics of these types of power quality events. A power quality event may include an energy-related transient, for example. The at least one energy-related transient may include at least one of a voltage transient and a current transient, for example. Below is a table from IEEE Standard 1159-2019 (known art), which defines example categories and characteristics of power system electromagnetic phenomena.

| Categories | Typical spectra content | Typical duration | Typical voltage magnitude |
|---|---|---|---|
| 1.0 Transients | | | |
| 1.1 Impulsive | | | |
| 1.1.1 Nanosecond | 5 ns rise | <50 ns | |
| 1.1.2 Microsecond | 1 μs rise | 50 ns-1 ms | |
| 1.1.3 Millisecond | 0.1 ms rise | >1 ms | |
| 1.2 Oscillatory | | | |
| 1.2.1 Low frequency | <5 kHz | 0.3-50 ms | 0-4 pu[a] |
| 1.2.2 Medium frequency | 5-500 kHz | 20 μs | 0-8 pu |
| 1.2.3 High frequency | 0.5-5 MHz | 5 μs | 0-4 pu |
| 2.0 Short-duration root-mean-square (rms) variations | | | |
| 2.1 Instantaneous | | | |
| 2.1.1 Sag | | 0.5-30 cycles | 0.1-09 pu |
| 2.1.2 Swell | | 0.5-30 cycles | 1.1-1.8 pu |
| 2.2 Momentary | | | |
| 2.2.1 Interruption | | 0.5 cycles-3s | <0.1 pu |
| 2.2.2 Sag | | 30 cycles-3s | 0.1-0.9 pu |
| 2.2.3 Swell | | 30 cycles-3s | 1.1-1.4 pu |
| 2.2.4 Voltage Imbalance | | 30 cycles-3s | 2%-15% |
| 2.3 Temporary | | | |
| 2.3.1 Interruption | | >3s-1 min | <0.1 pu |
| 2.3.2 Sag | | >3s-1 min | 0.1-0.9 pu |
| 2.3.3 Swell | | >3s-1 min | 1.1-1.2 pu |
| 2.3.4 Voltage Imbalance | | >3s-1 min | 2%-15% |
| 3.0 Long duration ms variations | | | |
| 3.0 Long duration ms variations | | | |
| 3.1 Interruption, sustained | | >1 min | 0.0 pu |
| 3.2 Undervoltages | | >1 min | 0.8-0.9 pu |
| 3.3 Overvoltages | | >1 min | 1.1-1.2 pu |
| 3.4 Current overload | | >1 min | |
| 4.0 Imbalance | | | |
| 4.1 Voltage | | steady state | 0.5-5% |
| 4.2 Current | | steady state | 1.0-3.0% |
| 5.0 Waveform distortion | | | |
| 5.1 DC offset | | steady state | 0-0.1% |
| 5.2 Harmonics | 0-9 kHz | steady state | 0-20% |
| 5.3 Interharmonics | 0-9 kHz | steady state | 0-2% |
| 5.4 Notching | | steady state | |
| 5.5 Noise | broadband | steady state | 0-1% |
| 6.0 Voltage fluctuations | <25 Hz | intermittent | 0.1-7% |
| | | | 0.2-2 $P_{st}$[b] |
| 7.0 Power frequency variations | | <10s | ±0.10 Hz |

NOTE—These terms and catagories apply to power quality measurements and are not to be confused with similar terms defined in IEEE Std 1366 ™ -2012 [B30] and other reliability-related standards, recommended practices, and guides.
[a] The quantity pu refers to per unit, whic is dimensionless. The quantity 1.0 pu corresponds to 100%. The nominal condition is often considered to be 1.0 pu. In this table, the nominal peak value is used as the base and the nominal ms value is used as the base form ms variations.
[b] Flicks severity index $P_{st}$ as defined in IEC 61000-415:2010 [B17] and IEEE Std 1453 ™ [B31].

It is understood that the above table is one standards body's (IEEE in this case) way of defining/characterizing power quality events. It is understood there are other standards that define power quality categories/events as well, such as the International Electrotechnical Commission (IEC), American National Standards Institute (ANSI), etc., which may have different descriptions or power quality event types, characteristics, and terminology. It is also understood that the energy-related event(s) that may be detected at block 810 may include other types of events besides power quality events in some embodiments.

Referring briefly back to block 745 of method 700, if some form of Condition Based Monitoring of an asset or a group of assets is being tracked, any drastic change may be detected as an event (e.g., in the same way any new abnormal energy consumption may be triggering an event/alarm). Recurring patterns or associations of events may also be detected in accordance with embodiments of this disclosure. This will become clearer at block 825, for example, as discussed further below, where the model(s) generated at block 825 correspond to initial or baseline/reference model(s). Suffice to say that a baseline may be composed of more than one event/baseline. Such a combination may be described as a pattern (e.g., when load A switched "On" and is "stable at 60%" and load B is "switching off"). In accordance with some embodiments of this disclosure, an event may be created based on a specific pattern which may be significantly impacting a process (e.g., when generating a specific combination of power quality events, such as a voltage swell in conjunctions with harmonics). Other types of patterns such as sequences/steps/co-occurrences of specific events could also be described as patterns and be modeled and tracked/detected accordingly.

Returning now to block 810, if it is determined that at least one energy-related event/change is detected in the electrical system, the method proceeds to block 815 where the detected energy-related event(s)/change(s) may be evaluated and characterized/quantified. For example, in one example implementation in which the detected energy-related event(s) include an energy-related transient, an impact of the energy-related transient may be quantified. For example, the effects of the energy-related transient on equipment in the electrical system may be evaluated and classified as at least one of: an intermittent interruption, a chronic degradation, a latent failure, and a catastrophic failure. Additional aspects of quantifying impacts of energy-related transients on equipment in an electrical system are discussed further in connection with co-pending U.S. patent application Ser. No. 16/841,493, filed on Apr. 6, 2020 and entitled SYSTEMS AND METHODS FOR MANAGING ENERGY-RELATED STRESS IN AN ELECTRICAL SYSTEM, which application is assigned to Schneider Electric, the same assignee as the present disclosure. However, let it suffice here to say that intermittent interruptions may occur, for example, when a transient event is injected into a data or control network, resulting in lost or corrupted data. Additionally, chronic degradation may occur, for example, when repetitive transient events diminish the integrity of an exposed component (or components). Further, latent failures are similar to chronic degradation, except that they are precipitated by a significant transient event that damages components, but not to the point that the component cannot perform its intended function. It is understood that intermittent interruptions, chronic degradations, latent failures, and catastrophic failures are but a few of many possible ways in which the at least one energy-related transient may be classified. It is also understood that energy-related transients are but one of many potential types of energy-related event(s)/change(s) that may be detected at block 810. For example, as discussed above, the energy-related event(s)/change(s) may include other types of power quality events.

At block 810, if it is alternatively determined that at least one energy-related event/change is not detected in the electrical system, the method proceeds to block 820 where the energy-related data from or derived from the initial energy-related signals captured at block 805 is further processed. For example, in some embodiments the energy-related data may be further processed to track and identify trends in the energy-related data that do not correspond to energy-related event(s), at least based on an initial analysis of the energy-related data. For example, select information associated with the energy-related data may be tracked over a predetermined time period and may be stored for that predetermined time period (or for longer or shorter periods of time). In embodiments in which energy-related transients are being monitored, for example, individual and accumulated energy-related stress and/or other types of data that may lead to or be indicative of energy-related transients may be tracked, for example, based on an analysis of data acquired during various captures of energy-related signals (e.g., initial capture of energy-related signals at block 805, and additional captures of energy-related signals at block 830, as will be further discussed below).

It is understood that there are many different ways to "track" energy-related transients and/or other types of events/changes in the electrical system and/or loads. For example, with respect to tracking energy-related transients, the accumulation of transient-related activity may be tracked by location, magnitude, duration, energy content frequency content, and so forth. These may also be tracked by individual event and/or by accumulating two or more individual events together. For example, the measured or calculated energy from multiple events may be added together to determine the accumulated transient stress at an IED's particular location.

In accordance with some embodiments of this disclosure, information about the electrical system may also be learned and modeled at block 825. More particularly, subsequent to evaluating and characterizing/quantifying detected energy-related event(s) at block 815, and/or subsequent to further processing the energy-related data from or derived from the energy-related signals at block 820, characteristics about the electrical system and its associated components (e.g., loads) may be learned from the energy-related data and modeled based on the information learned. In accordance with some embodiments of this disclosure, the model(s) may be built or generated automatically (i.e., through self-learning) or semi-automatically, for example, in response to initial input from a user. It is understood that the model(s) may be generated using substantially any energy-related data (and, potentially other data) in some embodiments. The model generation data (i.e., the energy-related data and/or the other data) may include, for example, any and all available time-series data, real-time data, logged data, spot check data, user requested data, system requested data, alarm data, etc. The model generation data may be for at least one measurement, calculated or derived value and/or characteristic (e.g., classification), from at least one current/voltage phase, etc. It is understood that the model(s) may be updated, for example, in response to additional input data received (e.g., additional energy-related data) and, in some instances, tracked (such as the tracked select information associated with the energy-related data discussed above). Additional aspects of model evaluation and updating are discussed further in connection with block 840-855 below, for example.

In accordance with some embodiments of this disclosure, the model(s) generated at block 825 correspond to initial or baseline/reference model(s). The initial or baseline model(s) may include, for example, characteristic baseline(s)/reference(s) for the electrical system and its associated components). The baseline(s)/reference(s) can be developed or learned, for example, with respect to an event's magnitude, duration, percent load impacted, and/or any other electrical parameter, metadata, or IED specification for a particular period (e.g., present period). The baseline(s)/reference(s) may indicate stable states or values or shapes or trends or patterns, and be used to set recovery alarm thresholds, assess recovery time performance and identify opportunities for improvement, estimate actual vs. expected recovery time and costs, improve accuracy of estimates for impactful voltage events, and so forth. In accordance with some embodiments of this disclosure, the baseline(s)/reference(s) may be active baseline(s)/reference(s) that may change, for example, in response to changes in the electrical system (e.g., in response to the addition of and/or removal of electrical system components, as detected by one or more sensor devices in the electrical system). The active baseline(s)/reference(s) may correspond to best applicable baseline(s)/reference(s), for example (i.e., baseline(s)/reference(s) that are learned, modeled and tracked).

It is understood that baseline/reference models may range from simple to complex and may be created or determined for discrete IED locations, zones, or entire systems, for example. It is also understood that baseline/reference models may include baselines associated with specific operations. For example, a baseline may be associated with or linked to a boiler running either at 40% of its maximal level, at 60% and at 100%. The system would be able to learn (e.g., through user inputs, other systems' inputs or by deduction) these operational levels. The system may then detect any change (e.g., switching on or off, or changing from 40% to 60%, for example), and assign each of these changes to a specific model (e.g., first "on"+"switching unstable period," then "on"+"stable at 40%," then "on"+"stable at 60%," etc.). A new derived time series of operational events may also be generated or recreated. This example illustrates that several models may be applied and combined to create richer models (or meta-models), and these richer models may become new time series data themselves, enabling new analysis.

At block 830, additional energy-related signals (or waveforms) are measured and data is captured, collected, stored, etc. by at least one IED (and/or control system) in the electrical system. In accordance with some embodiments of this disclosure, the types of energy-related signals captured at block 825 are the same as or similar to the types of energy-related signals captured at block 805 (e.g., regular interval logged data, event triggered data, collected status and operations data, event waveform captures, deduced state and operations data, etc.). However, it is understood that additional or fewer types of energy-related signals may be captured at block 830 in some embodiments. In accordance with some embodiments of this disclosure, the additional energy-related signals captured at block 830 are captured at a second (and, sometimes a third, fourth, etc.) later time than the first or initial time(s) at which the initial energy-related signals at block 805 are captured.

At block 835, changes between the additional energy-related signals and previously captured energy-related signals (e.g., the initial energy-related signals captured at block 805) are identified and, in some instances, tracked. In accordance with some embodiments of this disclosure, the changes are identified based on a comparison of energy-related data from or derived from the additional energy-related signals and energy-related data from or derived from the previously captured energy-related signals.

At block 840, it is determined if the previously generated model(s) (e.g., the baseline/reference model generated at block 825) needs to be updated or re-generated. For example, in one example implementation it may be determined if the previously generated model(s) needs to be updated or re-generated based on the identified changes at block 835. In embodiments in which no or few or relatively minor changes are detected, for example, it may be determined that the previously generated model(s) do not need to be re-generated (but, rather, can stay the same or be updated). In embodiments in which major changes are detected, for example, due to the occurrence of an energy-related event and/or change(s) in the electrical system, it may be determined that the previously generated model(s) need to be re-generated. If it is determined the model(s) need to be updated or re-generated, the method may proceed to block 845. Alternatively, if it is determined that the model(s) do not need to be updated or re-generated, the method proceeds to block 860.

At block 845, the model(s) are updated or re-generated, for example, in response to the analysis performed in previous blocks. In one example implementation, the model(s) may be updated or re-generated based on one or more of the changes tracked and identified in the additional energy-related signals captured at block 830. Typically, this would happen when a model is based on data from other systems. An example would be when a model is linked to one specific manufacturing process. However, this may change if a new process now uses the same machine in a similar way. In this case, the model may need to be re-evaluated to be able to discriminate between the two processes. New derived values from discrimination analysis (e.g., by using a multivariate correlation analysis or any type of unsupervised machine learning algorithms) may help create two more refined models, one for each process.

At block 850, the updated or re-generated (i.e., new) model(s) are tested. For example, one or more test parameters may be provided as inputs to the updated or re-generated model(s), and one or more test outputs may be generated in response thereto as outputs of the updated or re-generated (i.e., new) model(s). The test outputs may be evaluated and used to determine if the updated or re-generated model(s) are acceptable at block 855. In one example implementation, at block 855 it is determined if the updated or re-generated model(s) are a best possible model. At block 855, if it is determined that the updated or re-generated model(s) are acceptable, the method may proceed to block 860. Alternatively, if it is determined that the updated or re-generated model(s) are not acceptable, the method may return to block 845 where the model(s) may be updated or re-generated again.

At block 860, identification and/or classification may be performed using the model(s). For example, at least one variation/change may be identified in captured energy-related signals using the model(s), and the at least one identified variation/change may be characterized and/or quantified using the model(s). Additionally, characteristics and/or quantities associated with time-series information associated with the energy-related signals may be evaluated using the model(s) to identify at least one potential load type associated with the characterized and/or quantified at least one identified variation/change.

It is understood that additional and/or alternative information may be identified and/or classified using the model(s). For example, operations linked to the identified at least one potential load type may be identified using the model(s). Additionally, electrical system components and operations not linked to the identified at least one potential load type may be identified using the model(s).

Subsequent to block 860, the method may end in some embodiments. In other embodiments, the method may return to block 805 (or any other block in method 800) and repeat again. In some embodiments in which the method ends after block 860, the method may be initiated again in response to user input and/or a control signal, for example. It is understood that method 800 may include one or more additional blocks or steps in some embodiments.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to monitor energy-related data in an electrical system. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above. Further, any/all of the processes may include or exclude any aspect/element described herein and/or may be performed in any sequence.

Accordingly, it is submitted that that scope of the patent should not be limited to the described embodiments but rather should be limited only by the spirit and scope of the following claims.

What is claimed is:

1. A method for monitoring energy-related data in an electrical system, comprising:
    processing energy-related data from or derived from energy-related signals captured by at least one intelligent electronic device (IED) in the electrical system to identify at least one variation/change in the energy-related signals;
    determining if the at least one identified variation/change meets a prescribed threshold or thresholds;
    in response to the at least one identified variation/change meeting the prescribed threshold or thresholds, characterizing and/or quantifying the at least one identified variation/change;
    appending information related to the characterized and/or quantified at least one identified variation/change to time-series information associated with the energy-related data;
    evaluating characteristics and/or quantities associated with the time-series information to identify at least one potential load type associated with the characterized and/or quantified at least one identified variation/change, the at least one potential load type corresponding to at least one subset of load types in the electrical system; and
    taking one or more actions in response to identifying the at least one potential load type.

2. The method of claim 1, wherein the electrical system includes a plurality of load types, and the at least one subset of load types includes one or more of the plurality of load types.

3. The method of claim 2, wherein the plurality of load types include machinery, apparatuses and/or components associated with a particular application, applications, and/or process(es).

4. The method of claim 1, wherein the at least one subset of load types includes a single load.

5. The method of claim 1, wherein the at least one subset of load types includes an aggregation of two or more loads.

6. The method of claim 1, wherein the electrical system is associated with at least one facility, and the at least one facility is associated with at least one process and/or at least one application.

7. The method of claim 6, wherein the at least one identified variation/change in the energy-related signals is associated with a particular step and/or a particular portion of the at least one process and/or the at least one application.

8. The method of claim 1, further comprising:
    storing information associated with identifying the at least one potential load type to at least one memory device for future analyses/uses.

9. The method of claim 8, wherein the stored information includes at least one of: the at least one identified variation/change, the characterized and/or quantified at least one identified variation/change, the time-series information, and the evaluated characteristics and/or quantities associated with the time-series information.

10. The method of claim 8, wherein the stored information is used to generate a library of load types and associated start/run/change/stop characteristics, or is added to a pre-existing library of load types and associated start/run/change/stop characteristics.

11. The method of claim 1, wherein the at least one potential load type is selected from a plurality of potential loads types in a library of load types and associated start/run/change/stop characteristics.

12. The method of claim 1, further comprising: developing a confidence factor that the identified at least one potential load type is the actual load type, wherein the indication of the identified at least one potential load type includes the confidence factor.

13. The method of claim 12, further comprising: updating the confidence factor in response to user input, the user input including a user selection of the identified at least one potential load type from a list of a plurality of possible load types.

14. The method of claim 12, further comprising: updating the confidence factor in response to user input, the user input including user validation of the identified at least one potential load type.

15. The method of claim 1, wherein the one or more actions taken in response to identifying the at least one potential load type, include providing an indication of the identified at least one potential load type.

16. The method of claim 15, wherein the indication is provided via at least one of: a report, a text, an email, audibly, and an interface of a screen/display.

17. The method of claim 15, wherein the indication provides actionable recommendations for responding to the at least one identified variation/change.

18. The method of claim 17, wherein the actionable recommendations are based, at least in part, on the identified at least one potential load type or characteristics of the at least one potential load type.

19. The method of claim 1, wherein the one or more actions taken in response to identifying the at least one potential load type, include sending a message/information/command/signal to another system or device.

20. The method of claim 1, wherein the prescribed threshold or thresholds is or are a predetermined threshold or thresholds.

21. The method of claim 1, wherein the prescribed threshold or thresholds is or are a dynamic threshold or thresholds that change in response to changes in the electrical system, subsystems, processes and/or loads.

22. The method of claim 1, wherein characterizing and/or quantifying the at least one identified variation/change includes identifying what changed and to what degree it changed.

23. The method of claim 1, wherein appending information related to the characterized and/or quantified at least one identified variation/change to the time-series information, includes:
appending the time-series information with indications, metadata, characteristics and/or other information related to the characterized and/or quantified at least one identified variation/change.

24. The method of claim 1, wherein the energy-related signals captured by the at least one IED include at least one of a voltage signal, a current signal, input/output (I/O) data, and a derived energy-related value.

25. The method of claim 24, wherein the I/O data includes at least one of on/off status(es), open/closed status(es), high/low status(es), temperature(s), pressure(s), and volume(s).

26. The method of claim 24, wherein the derived energy-related value includes at least one of a calculated, computed, estimated, derived, developed, interpolated, extrapolated, evaluated, and otherwise determined additional energy-related value from the at least one of the voltage signal and/or the current signal.

27. The method of claim 24, wherein the derived energy-related value includes at least one of active power(s), apparent power(s), reactive power(s), energy(ies), harmonic distortion(s), power factor(s), magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase current(s), phase angle(s), impedance(s), sequence component(s), total voltage harmonic distortion(s), total current harmonic distortion(s), three-phase current(s), phase voltage(s), line voltage(s) and/or other similar/related parameters.

28. The method of claim 24, wherein the derived energy-related value includes at least one energy-related characteristic, the energy-related characteristic including magnitude, direction, phase angle, percentage, ratio, level, duration, associated frequency components, impedance, energy-related parameter shape, and/or decay rate.

29. The method of claim 1, wherein the at least one IED includes at least one metering device.

30. A system for monitoring energy-related data in an electrical system, comprising:
at least one processor; and
at least one memory device coupled to the at least one processor, the at least one processor and the at least one memory device configured to:
process energy-related data from or derived from energy-related signals captured by at least one intelligent electronic device (IED) in the electrical system to identify at least one variation/change in the energy-related signals;
determine if the at least one identified variation/change meets a prescribed threshold or thresholds;
in response to the at least one identified variation/change meeting the prescribed threshold or thresholds, characterize and/or quantify the at least one identified variation/change;
append information related to the characterized and/or quantified at least one identified variation/change to time-series information associated with the energy-related data;
evaluate characteristics and/or quantities associated with the time-series information to identify at least one potential load type associated with the characterized and/or quantified at least one identified variation/change, the at least one potential load type corresponding to at least one subset of load types in the electrical system; and
provide an indication of the identified at least one potential load type.

31. The system of claim 30, wherein the system includes the at least one TED.

32. The system of claim 30, wherein the system corresponds to/includes/is a control system associated with the electrical system.

* * * * *